(12) United States Patent
Wongsenakhum et al.

(10) Patent No.: US 10,090,174 B2
(45) Date of Patent: Oct. 2, 2018

(54) APPARATUS FOR PURGING SEMICONDUCTOR PROCESS CHAMBER SLIT VALVE OPENING

(71) Applicant: Lam Research Corporation, Fremont, CA (US)

(72) Inventors: Panya Wongsenakhum, Santa Clara, CA (US); Peter Krotov, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 386 days.

(21) Appl. No.: 15/058,052

(22) Filed: Mar. 1, 2016

(65) Prior Publication Data

US 2017/0256424 A1    Sep. 7, 2017

(51) Int. Cl.
| | |
|---|---|
| *H01L 21/67* | (2006.01) |
| *C23C 14/56* | (2006.01) |
| *C23C 16/54* | (2006.01) |
| *C23C 16/455* | (2006.01) |
| *H01J 37/32* | (2006.01) |
| *H01L 21/677* | (2006.01) |

(52) U.S. Cl.
CPC .. *H01L 21/67017* (2013.01); *C23C 16/45544* (2013.01); *C23C 16/45563* (2013.01); *H01J 37/3244* (2013.01); *H01J 37/32899* (2013.01); *H01L 21/67126* (2013.01); *H01L 21/67739* (2013.01); *C23C 14/56* (2013.01); *C23C 14/564* (2013.01); *C23C 16/54* (2013.01); *H01J 2237/334* (2013.01); *H01J 2237/3321* (2013.01)

(58) Field of Classification Search
None
See application file for complete search history.

(56) References Cited

U.S. PATENT DOCUMENTS

| | | | |
|---|---|---|---|
| 6,045,620 A * | 4/2000 | Tepman | H01L 21/67126 118/733 |
| 6,602,346 B1 * | 8/2003 | Gochberg | H01L 21/67126 118/715 |
| 6,800,172 B2 * | 10/2004 | Carpenter | C23C 16/4409 118/719 |
| 8,011,381 B2 | 9/2011 | Newman et al. | |
| 8,815,616 B2 * | 8/2014 | Bang | F16K 51/02 118/686 |
| 2015/0083330 A1 | 3/2015 | Madiwal et al. | |

* cited by examiner

*Primary Examiner* — Karla A Moore
(74) *Attorney, Agent, or Firm* — Weaver Austin Villeneuve & Sampson LLP

(57) ABSTRACT

A semiconductor processing chamber is provided and may include a wafer transfer passage that extends through a chamber wall and has an inner passage surface defining an opening, an insert including an insert inner surface defining an insert opening, and a gas inlet. A first recessed surface of the wafer transfer passage extending at least partially around and outwardly offset from the inner passage surface, a first insert outer surface extending at least partially around and outwardly offset from the insert inner surface, and a first wall surface extending between the inner passage surface and the first recessed surface, at least partially define a gas distribution channel fluidically connected to the gas inlet, the first recessed surface is separated from the first insert outer surface by a first distance and an insert front surface faces and is separated from the first wall surface by a first gap distance.

23 Claims, 22 Drawing Sheets

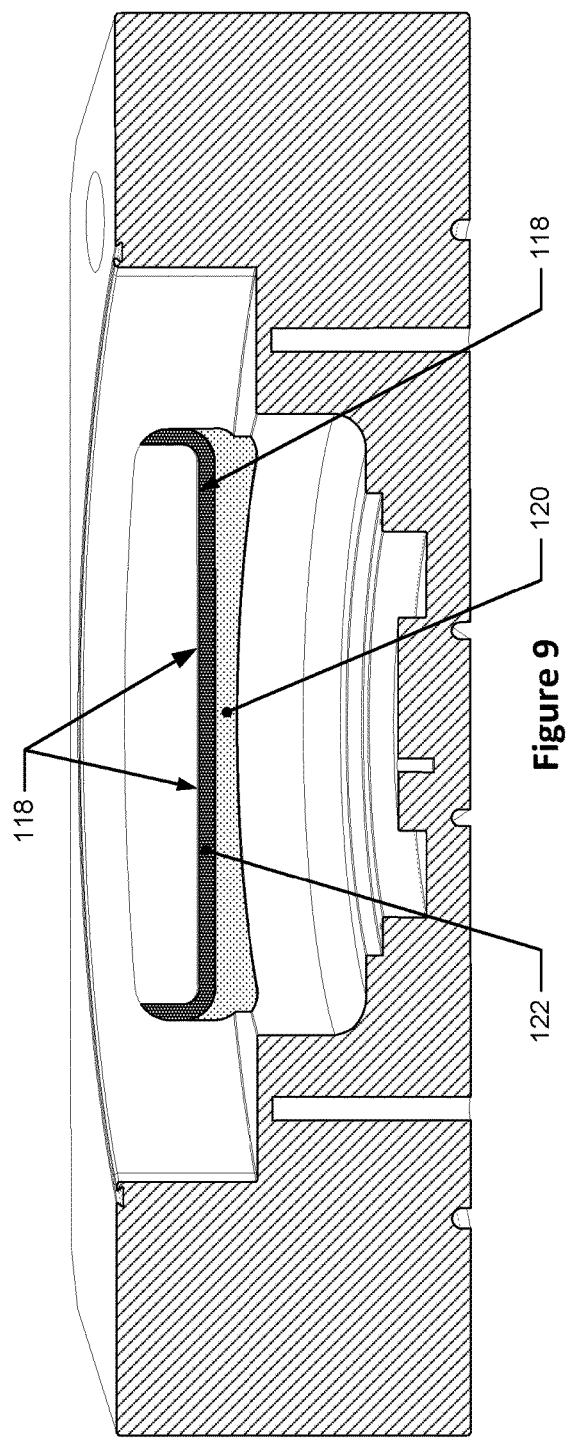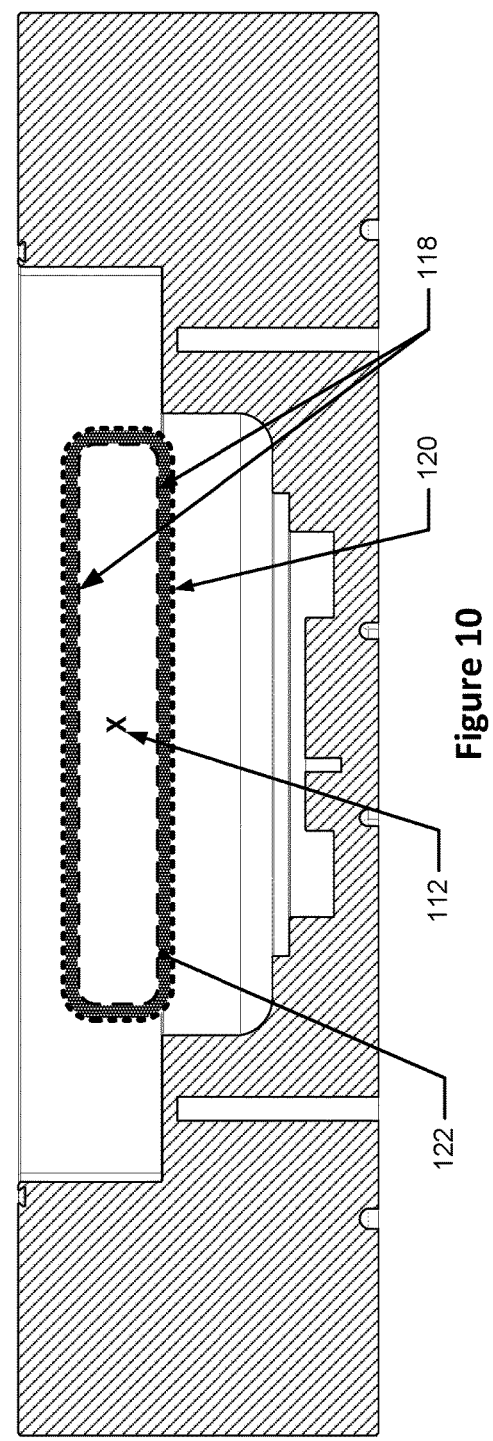

APPARATUS FOR PURGING SEMICONDUCTOR PROCESS CHAMBER SLIT VALVE OPENING

BACKGROUND

Some semiconductor processing tools move wafers into and out of processing chambers through a passage that extends through a processing chamber wall from an area outside the processing chamber to an interior of the processing chamber. Such passages may have a gate valve, i.e. slit valve, on an end of the passage that may open in order to allow a wafer to pass through the passage, and that may close-off and/or seal (e.g., a pressure or fluid seal) the passage such that the interior of the processing chamber is isolated from the area outside the processing chamber.

BRIEF DESCRIPTION OF THE DRAWINGS

FIG. 9 depicts an off-angle view of the back of the section of the processing chamber in FIG. 7.

FIG. 10 depicts an elevated view of the back of the section of the processing chamber in FIG. 7.

SUMMARY

Figure 1:
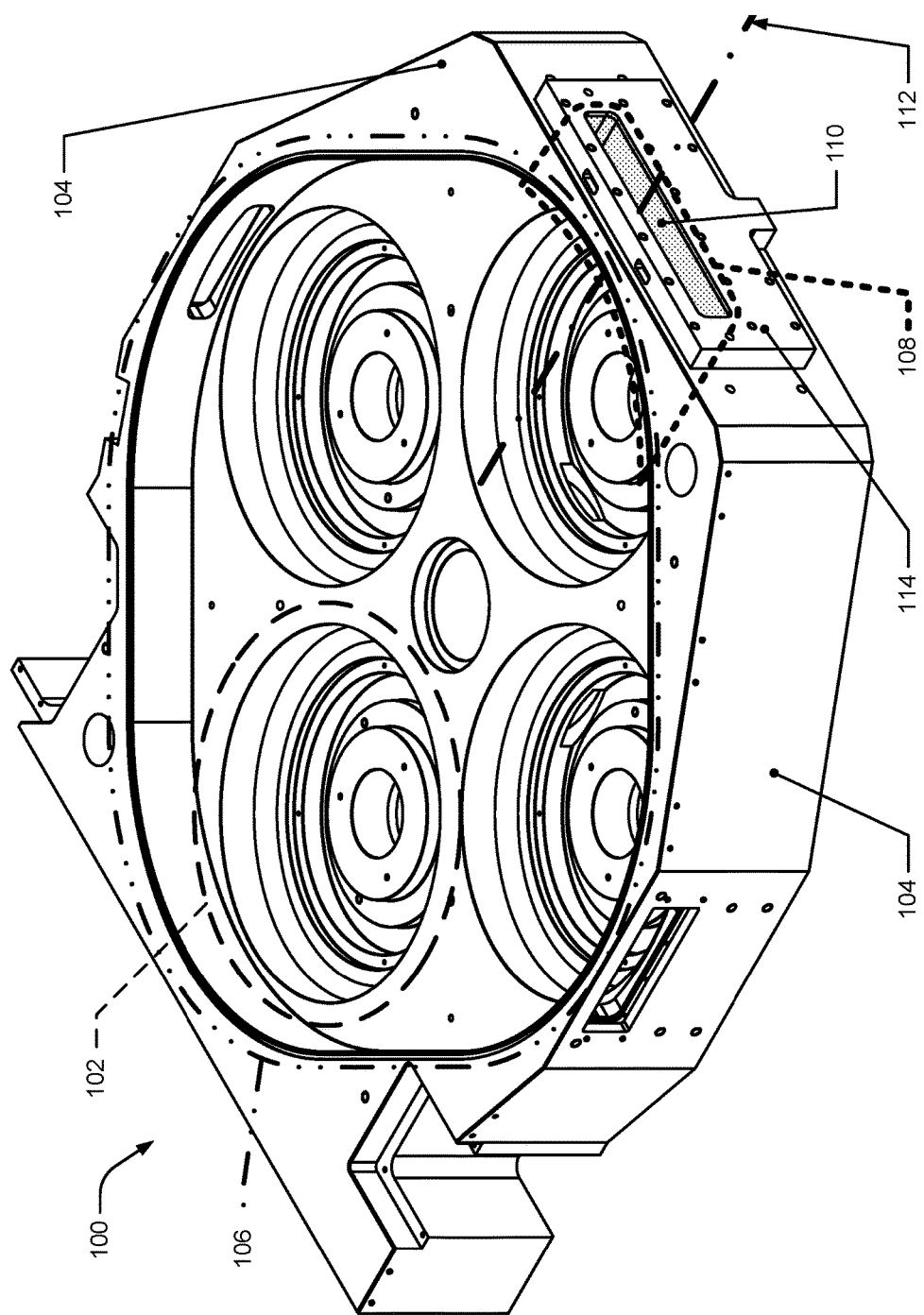
FIG. 1 depicts an isometric view of an example processing chamber.
Figure 2:
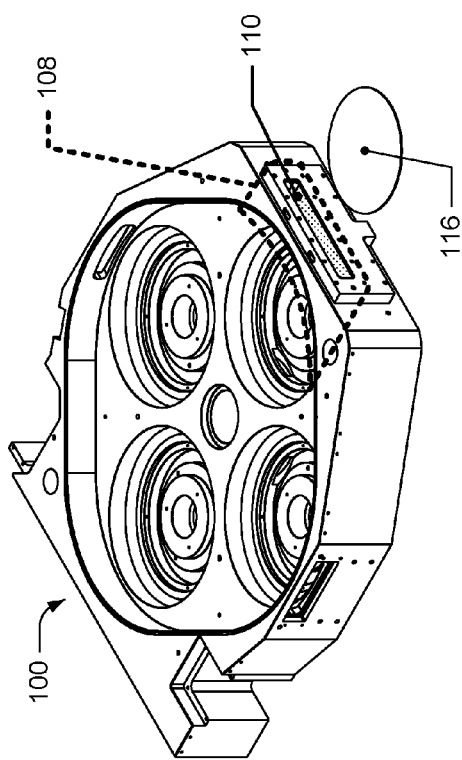
FIGS. 2 through 5 depict a wafer passing through the wafer transfer passage of the example processing chamber of FIG. 1.
Figure 3:
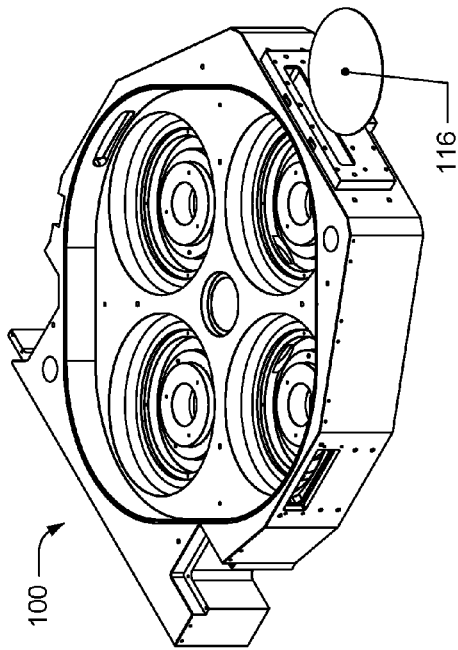
Figure 4:
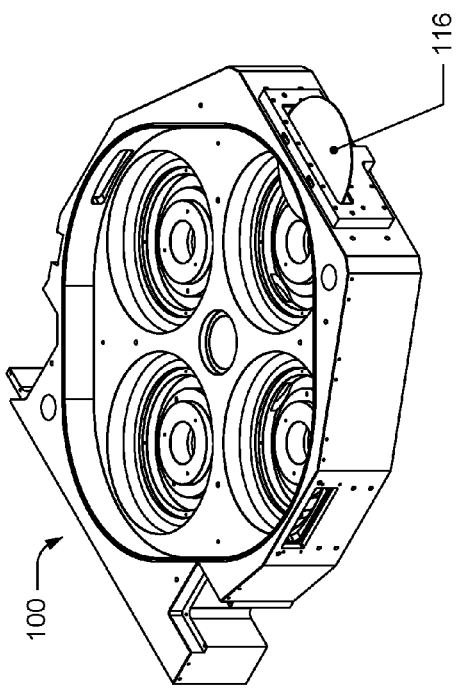
Figure 5:
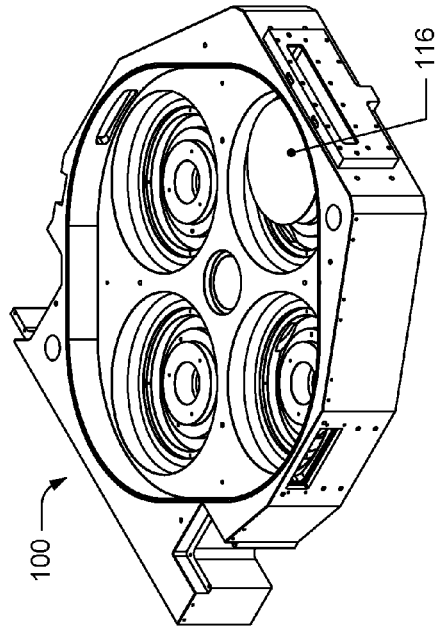

In one embodiment, a semiconductor processing chamber may be provided. The semiconductor processing chamber may include an interior volume for semiconductor processing, a chamber wall that at least partially bounds an outside of the semiconductor processing chamber and the interior volume, and a gas inlet. The semiconductor processing chamber may also include a wafer transfer passage that extends through the chamber wall along a first axis from the outside of the semiconductor processing chamber to the interior volume and has an inner passage surface that defines an opening with a first substantially rectangular cross-sectional area perpendicular to the first axis, a first recessed surface that extends at least partially around and is outwardly offset from the inner passage surface when viewed along the first axis, and a first wall surface that extends between the inner passage surface and the first recessed surface. The semiconductor processing chamber may also include an insert that includes an insert inner surface that defines an insert opening with a second substantially rectangular cross-sectional area perpendicular to the first axis, a first insert outer surface that extends at least partially around and is outwardly offset from the insert inner surface when viewed along the first axis, and an insert front surface that faces the first wall surface. The first recessed surface, the first insert outer surface, and the first wall surface may at least partially define a gas distribution channel, the gas distribution channel may be fluidically connected to the gas inlet, the first recessed surface may be separated from the first insert outer surface by a first distance, and the insert front surface may be separated from the first wall surface by a first gap distance.

In one such embodiment, the insert may further include a second insert outer surface that extends at least partially around and is outwardly offset from the first insert outer surface when viewed along the first axis.

In further such embodiments, the second insert outer surface may be proximate to the first recessed surface.

In one further such embodiment, the insert may further include a second wall surface that extends between the second insert outer surface and the first insert outer surface, and the gas distribution channel may be at least partially defined further by the second wall surface.

In some further such embodiments, the wafer transfer passage may further include a second recessed surface that extends around the inner passage surface and is inwardly offset from the first recessed surface when viewed along the first axis, the wafer transfer passage may further includes a third wall surface that extends between the second recessed surface and the first recessed surface, and the gas distribution channel may be at least partially defined further by the third wall surface.

In one such embodiment, the wafer transfer passage may further include a second recessed surface that extends around the inner passage surface and is inwardly offset from the first recessed surface when viewed along the first axis.

In further such embodiments, the first insert outer surface may be proximate to the second recessed surface.

In further such embodiments, the wafer transfer passage may further includes a third wall surface that extends between the second recessed surface and the first recessed surface, and the gas distribution channel may be at least partially defined further by the third wall surface.

In one such embodiment, the gas distribution channel may follow a first path that extends at least partially around the insert inner surface and may have a third cross-sectional area that is perpendicular to the first path.

In further such embodiments, the first path may extend fully around the insert inner surface.

In further such embodiments, the third cross-sectional area may remain substantially constant along the first path.

In further such embodiments, the third cross-sectional area may vary along the first path.

In further such embodiments, the first path may have a first point and a second point, such that the first point is closer to the gas inlet along the first path than the second point, and the third cross-sectional area may be larger at the second point than at the first point.

In some embodiments, the insert may be made of two or more parts that, when assembled, form in aggregate the insert inner surface, the first insert outer surface, and the insert front surface.

In some embodiments, the first recessed surface may extend fully around the inner passage surface.

In some embodiments, the first insert outer surface may extend fully around the insert inner surface.

In one such embodiment, the insert may include one or more spacers that contact the first wall surface to space the insert front surface away from the first wall surface by the first gap distance.

In further such embodiments, the one or more spacers may extend from the insert front surface.

In some embodiments, the insert front surface may be substantially parallel to the first wall surface.

In some embodiments, the insert front surface may be at an oblique angle with respect to the first wall surface.

In some embodiments, the first cross-sectional area may be substantially equal in size and shape to the second cross-sectional area.

In some embodiments, the inner passage surface may be aligned with the insert inner surface.

In one embodiment, a kit may be provided. The kit may include a) a semiconductor processing chamber that includes an interior volume for semiconductor processing, a chamber wall that at least partially bounds an outside of the semiconductor processing chamber and the interior volume, a wafer transfer passage that extends through the chamber wall along a first axis from the outside of the semiconductor processing chamber to the interior volume and has an inner passage surface that defines an opening with a first substantially rectangular cross-sectional area perpendicular to the first axis, a first recessed surface that extends at least partially around and is outwardly offset from the inner passage surface when viewed along the first axis, and a first wall surface that extends between the inner passage surface and the first recessed surface, and a gas inlet fluidically connected to the first recessed surface. The kit may also include b) an insert that includes an insert inner surface that defines an insert opening with a second substantially rectangular cross-sectional area perpendicular to the first axis, a first insert outer surface that extends at least partially around and is outwardly offset from the insert inner surface when viewed along the first axis, and an insert front surface. At least part of the insert is configured to be inserted in into the wafer transfer passage, the chamber wall is configured to have at least part of the insert inserted into the wafer transfer passage. When at least part of the insert is installed in the wafer transfer passage, the first recessed surface, the first insert outer surface, and the first wall surface at least partially define a gas distribution channel, the gas distribution channel is fluidically connected to the gas inlet, the first recessed surface is separated from the first insert outer surface by a first distance, and the insert front surface is separated from the first wall surface by a first gap distance.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present disclosure, are apparent from the description and illustrations. As such, the below implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the below implementations has been presented for the purposes of illustration and description.

The present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

Disclosed herein are embodiments, implementations, methods, techniques, and apparatuses for protecting a gate valve (or a slit valve, collectively referred to herein as a gate valve) of a semiconductor process chamber from adverse effects of the processing chamber, such as, for example, the process chemistry involved with semiconductor processing.

Many semiconductor processing tools (hereinafter "tools") utilize one or more processing chambers in order to process a semiconductor wafer or substrate (hereinafter "wafer"), using one or more types of processing on a wafer, such as deposition techniques that include atomic layer deposition, conformal film deposition, and chemical vapor deposition, as well as etching techniques, such as atomic layer etching. Such wafer processing typically involves the introduction and use of inert liquids and/or vapors; volatile liquids, vapors, and/or compounds; radiation; and/or plasma inside the processing chamber; all of these items may be considered collectively as "process chemistry". Also present in the processing chamber may be particles or debris that are generated during wafer processing. Some wafer processing may also occur at various pressures, including atmospheric and low-pressure environments, as well as different temperatures, including high temperatures.

Many tools transfer wafers into and out of processing chambers through a wafer transfer passage (hereinafter referred to as both "passage" or "wafer transfer passage") that extends through a processing chamber wall. A gate valve may be placed on an end of this wafer transfer passage that is outside the chamber and such a gate valve may open and close in order to allow a wafer to pass through the wafer transfer passage on its way to or from the processing chamber. The gate valve may also seal the processing chamber from the environment outside the processing chamber to prevent the process chemistry from exiting the processing chamber through the passage, as well as enabling the processing chamber to be depressurized and pressurized.

FIG. 1 depicts an isometric view of an example processing chamber. As can be seen, the example processing chamber 100 includes four wafer processing stations 102 (only one is identified and encircled for simplicity), a chamber wall 104, and an interior volume 106. The processing chamber 100 is shown without a top or cover in order to provide viewing of the interior of the processing chamber 100. Each processing station 102 is represented as a recessed hole in a bottom of the processing chamber 100; many items typically included in a processing chamber, such as a pedestal, showerhead, cooling and/or electrical conduit are not shown herein. The chamber wall 104 can be seen extending around and encompassing the interior volume 106, which is generally within the dashed-and-double-dotted line; an outer surface of the chamber wall 104 also partially bounds an outside of the processing chamber 100 and an inner surface of the chamber wall 104 also partially bounds the interior volume 106. The inter volume 106 is where the semiconductor processing occurs. The example processing chamber 100 also includes a wafer transfer passage 108 that is generally depicted within the dotted line. The wafer transfer passage 108 includes an opening 110, shown with shading, in the chamber wall 104 on the outside of the processing chamber 100, and extends through the chamber wall 104 from the opening 110 to the interior volume 106 along a first axis 112. A gate valve, not depicted, may be attached to the processing chamber 100 on a front plate 114 of the chamber wall 104. The front plate 114 may be considered a part of the chamber wall 104, even if provided by a separate component that is affixed to the processing chamber 100.

FIGS. 2 through 5 depict a wafer passing through the wafer transfer passage of the example processing chamber of FIG. 1. As can be seen, a wafer 116 may pass through the wafer transfer passage 108, including through the opening 110, and into the interior volume (not identified; the wafer transfer passage and the opening are only identified on FIG. 2 for clarity purposes); the wafer may also exit the interior volume by passing through the wafer transfer passage 108. Many tools use a robotic arm to transfer the wafer through the wafer transfer passage 108, which is not depicted in Figures BB through 5. The opening 110 and the wafer transfer passage 108 may be configured to allow a wafer and robotic arm to pass through the wafer transfer passage 108.

The present inventors have discovered that the gate valve may be adversely affected by the process chemistry (e.g., chemicals used in wafer processing as discussed above). For instance, some parts of the gate valve (e.g. rubber seals) may be damaged and/or destroyed by such process chemistry, thereby requiring maintenance and/or replacement which may increase cost, increase downtime of the processing chamber, increase labor, and decrease wafer throughput. The process chemistry may also cause condensation of chemistry, e.g. deposition of material, on portions of the gate valve, such as internal surfaces, which may decrease the functionality and effectiveness of the gate valve and which may cause improper operation and/or poor sealing of the gate valve. These adverse condensation effects may also require maintenance and replacement which again may increase cost, increase downtime of the processing chamber, increase labor, and decrease wafer throughput.

One current technique to prevent process chemistry from affecting the gate valve is to place a purge gas extension between the processing chamber wall (i.e. on the outside of the opening) and the gate valve. Some of these purge gas extensions are configured to supply and distribute a purge gas into the wafer transfer passage through orifices (e.g., holes) in the purge gas extension. This introduction of purge gas may create a partial barrier or partial gas curtain between the process chemistry and the gate valve.

However, numerous disadvantages exist with this current technique. For instance, the current technique increases the footprint, i.e. length, of the processing chamber. In one example, the purge gas extension is approximately 1.25 inches thick which results in a 2.5% increase in the length of the processing chamber. A longer processing chamber may require the use of a longer robotic arm to move the wafer which may result in an increased robotic arm cost, greater deformation of the robotic arm, reduced throughput to compensate for the increased travel distance of the wafer, and/or larger footprint of the robot arm unit. Furthermore, this current technique uses a sealing O-ring between the purge gas extension and the processing chamber which in turn may increase chamber leak rate and/or reduce the reliability of the processing chamber.

As discussed herein, the inventors of the present disclosure have developed novel embodiments, implementations, methods, techniques, and apparatuses for protecting the gate valve of a process chamber from adverse effects (e.g., processing chemistry) of the processing chamber. In one embodiment of the present disclosure, the processing chamber is modified to allow the insertion of an insert into at least part of a wafer transfer passage between the gate valve and the interior volume, with the insert extending at least partially around an opening of the wafer transfer passage, such that the combination of the insert into the wafer transfer passage creates a gas distribution channel as well as a gap between a first wall surface of the wafer transfer passage and the insert. When gas is supplied into the gas distribution channel, the gap distributes a generally uniform planar jet of gas into the wafer transfer passage. This planar jet of gas may create a consistent gas barrier between the processing chamber and the gate valve. For purposes of explanation, partial section views of the processing chamber will be shown and discussed.

Figure 6:
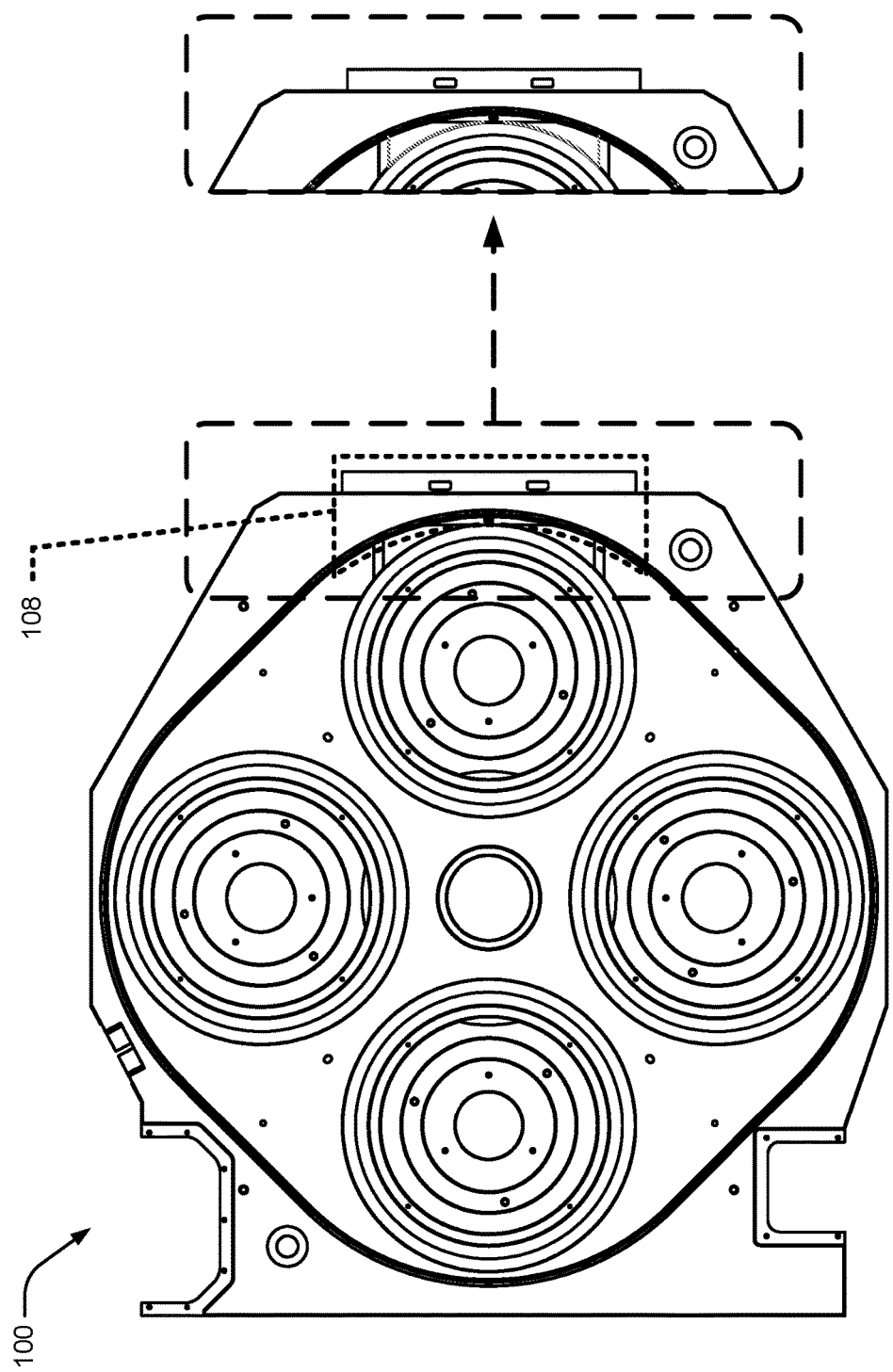
FIG. 6 depicts a top view of the processing chamber in FIG. 1 along with a section of the processing chamber.

FIG. 6 depicts a top view of the processing chamber in FIG. 1 along with a section of the processing chamber. The full, uncut processing chamber is on the left, and on the right is a partial "section" of processing chamber that includes the wafer transfer passage. It is this section that will be discussed further below.

Figure 7:
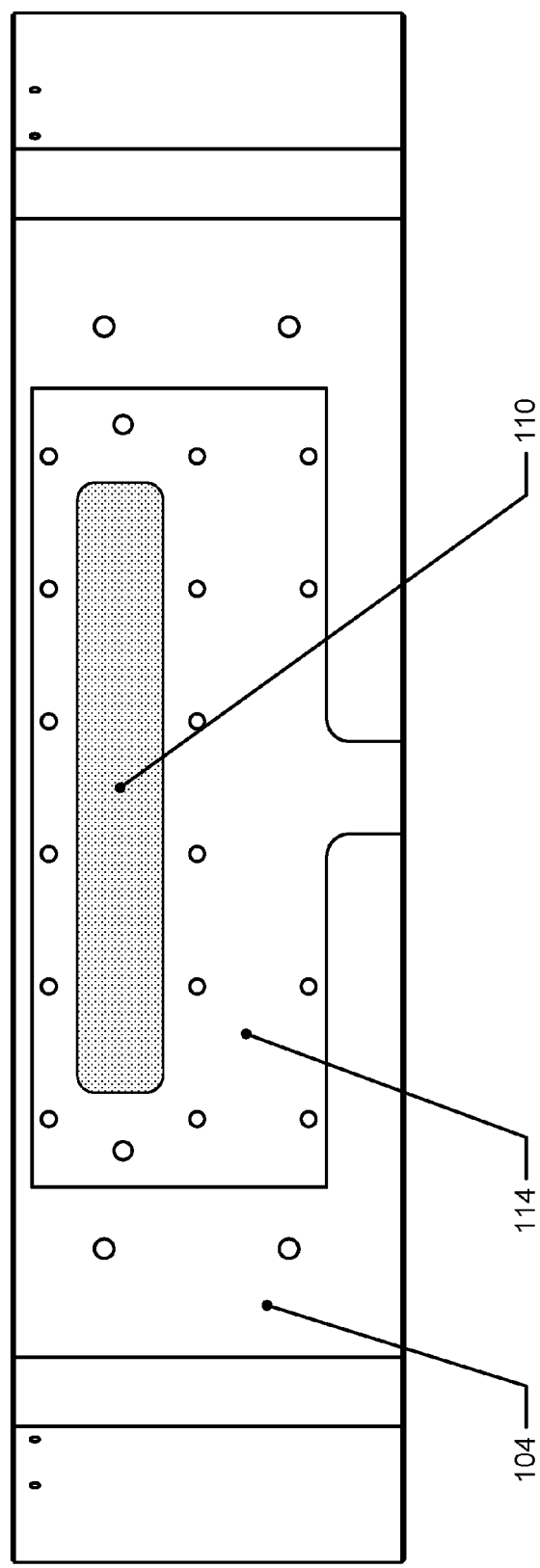
FIG. 7 depicts a plan front view of the section of the processing chamber in FIG. 6.

FIG. 7 depicts a plan front view of the section of the processing chamber in FIG. 6. The front plate 114 and a portion of the chamber wall 104 are identified, and the opening 110 of the wafer transfer passage 108 is identified with shading. The opening 110 may have a first substantially rectangular cross-sectional area perpendicular to the first axis 112. A substantially rectangular cross sectional area may include a rectangle with one or more rounded corners and/or one or more sides that may not be precisely parallel to an opposite side, such as within 10% of parallel. In some cases, the opening may be an obround opening, e.g., similar to a racetrack (two straight lines joined by semicircular endcaps); for the purposes of this disclosure, an obround opening may be considered to be "substantially rectangular."

Figure 8:
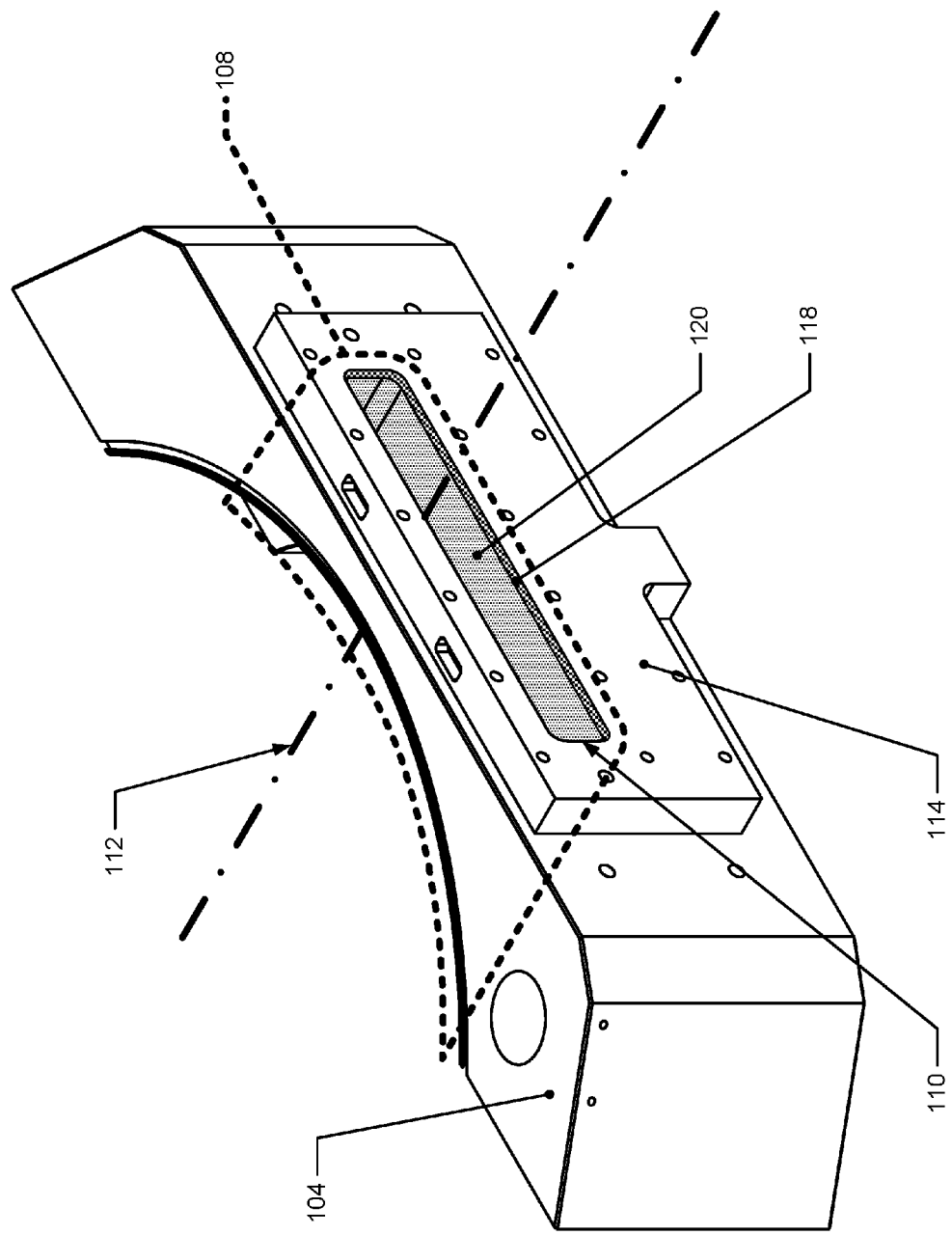
FIG. 8 depicts an isometric view of the section of the processing chamber in FIG. 7.

FIG. 8 depicts an isometric view of the section of the processing chamber in FIG. 7. The chamber wall 104, the front plate 114, and the first axis 112 can be seen again, but the opening 110 of the wafer transfer passage is identified at its perimeter. The wafer transfer passage 108, generally within the dotted line, extends through the chamber wall 104 along the first axis 112, and includes an inner passage surface 118 and a first recessed surface 120, both of which are partially depicted.

The inner passage surface 118 may define the opening 110 of the wafer transfer passage 108. As partially shown in FIG. 8, the inner passage surface 118 forms the boundary of the opening 110 (not identified) within the processing chamber wall 104. The opening 110 may also extend through the front plate 114 which in some embodiments, like that depicted in FIG. 8, is a part of the chamber wall 104.

Although only partially seen in FIG. 8, the first recessed surface 120 may extend at least partially around the inner passage surface 118. FIG. 9 depicts an off-angle view of the back of the section of the processing chamber in FIG. 7. Here, the first recessed surface 120 is shaded and can be seen extending at least partially around the inner passage surface 118, which is identified at its perimeter. The first recessed surface 120 may also be outwardly offset from the inner passage surface 118 when viewed along the first axis 112. FIG. 10 depicts an elevated view of the back of the section of the processing chamber in FIG. 7. From the viewing angle of FIG. 10, which is along the first axis 112 denoted by an "X", the inner passage surface 118 and the first recessed passage 120 can be seen in profile; these identified profile portions may be considered a perimeter of each surface, respectively. For illustration purposes, the inner passage surface 118 is shown as a dashed line while the first recessed surface 120 is shown as a dotted line. As depicted in FIG. 10, when viewed along the first axis 112, the first recessed passage 120 is outwardly offset from the inner passage surface 118. As used herein, unless otherwise specified or apparent from the context, "outwardly" means in a direction away from the first axis 112. In the embodiment shown in FIG. 10, the first recessed passage 120 can also be seen extending fully around the inner passage surface 118, when viewed along the first axis 112. In some other embodiments, the first recessed passage 120 may only extend around a portion or portions of the inner passage surface 118, but not fully around the inner passage surface 118, when viewed along the first axis 112.

In some embodiments, the inner passage surface 118 and the first recessed passage surface 120 may be parallel to each other. For instance, as shown in FIG. 10, the inner passage surface 118 and the first recessed passage surface 120 are parallel to each other as well as parallel to the first axis 112. In some such embodiments, these two surfaces may be substantially parallel to each other and/or the first axis 112, which may be with 10% of parallel.

The wafer transfer passage 108 may also include a first wall surface 122 that extends between the inner passage surface 118 and the first recessed surface 120. In FIG. 9, a portion of the first wall surface 122 can be seen extending between the inner passage surface 118 and the first recessed surface 120. In FIG. 10, the first wall surface 122 can be seen again extending between the inner passage surface 118 and the first recessed surface 120. In FIG. 10, the first wall surface 122 is normal to the first axis 112. In some embodiments, the first wall surface 122 may be substantially normal to the first axis 112, which may be within 10% of normal to the first axis 112. In some other embodiments, one or more portions of the first wall surface 122 may be at an oblique angle from the first axis 112.

Figure 11:
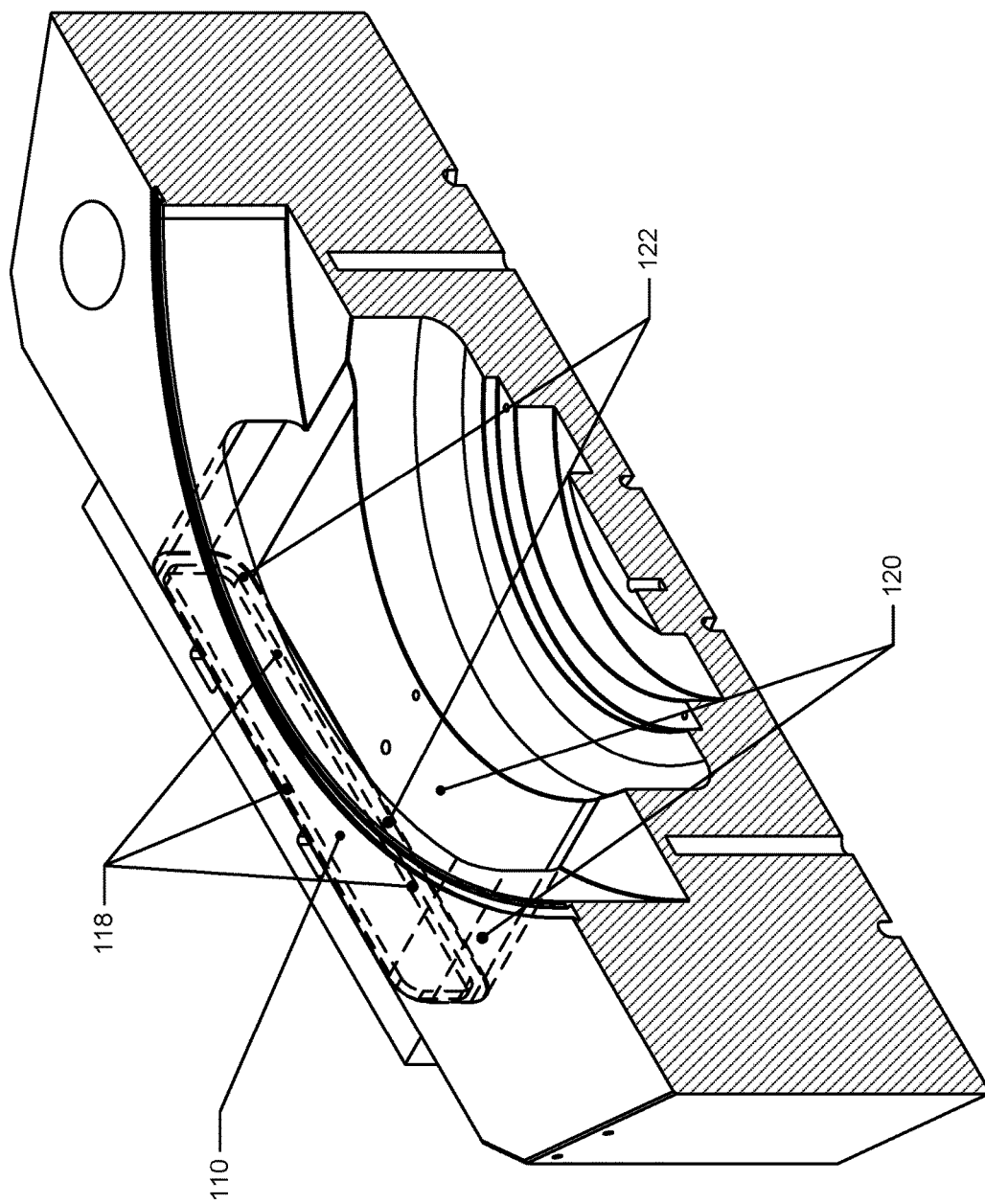
FIG. 11 depicts a different off-angle view of the section of processing chamber in FIG. 7.

FIG. 11 depicts a different off-angle view of the section of processing chamber in FIG. 7. As can be seen, at least some features of the wafer transfer passage 108 that are blocked from view by the processing chamber wall 104 are shown with dashed lines. The opening 110, the inner passage surface 118, the first recessed surface 120, and the 1 first wall surface are all identified in the Figure. As can be more clearly seen, the inner passage surface 118 bounds and defines the opening 110, the first recessed surface 120 extends around the inner passage surface 118, and the first wall surface 122 extends between these two surfaces.

Figure 12:
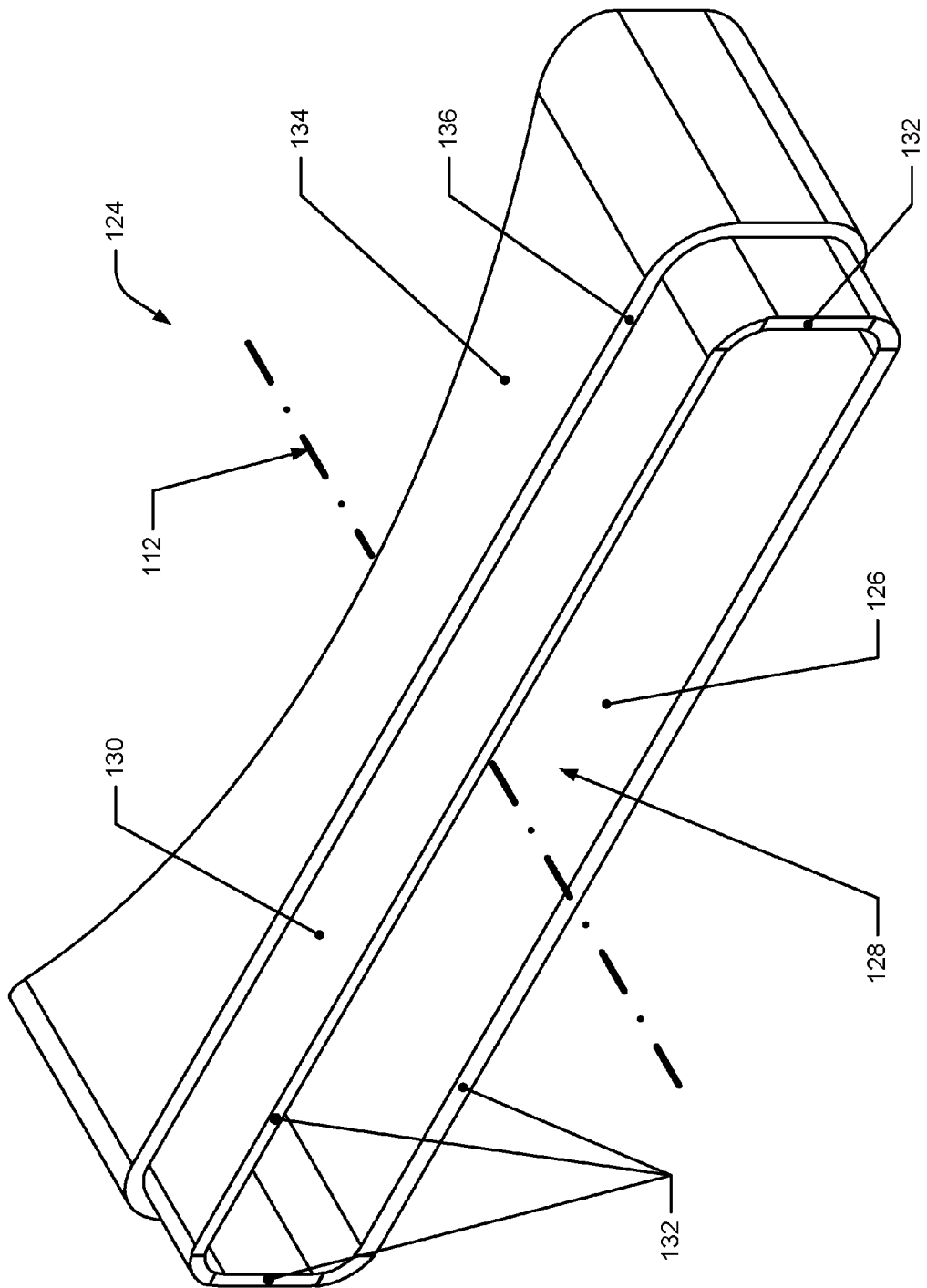
FIG. 12 depicts an isometric view of an example insert.

The semiconductor processing chamber 100 may also include an insert that may be inserted into at least a portion of the wafer transfer passage 108. FIG. 12 depicts an isometric view of an example insert. The insert 124 includes an insert inner surface 126, an insert opening 128, a first insert outer surface 130, and an insert front surface 132. The insert inner surface may define the insert opening 128. The insert opening 128 may have a second substantially rectangular cross-sectional area that may be perpendicular to the first axis 112. Similar to the first substantially rectangular cross-sectional area, the second substantially rectangular cross-sectional area may have rounded corners and may have edges that are substantially parallel to each other, such as within 10% of parallel, or be obround. The insert opening 128 may also be sized in order to allow a wafer and robot arm to pass through the insert opening 128.

Figure 13:
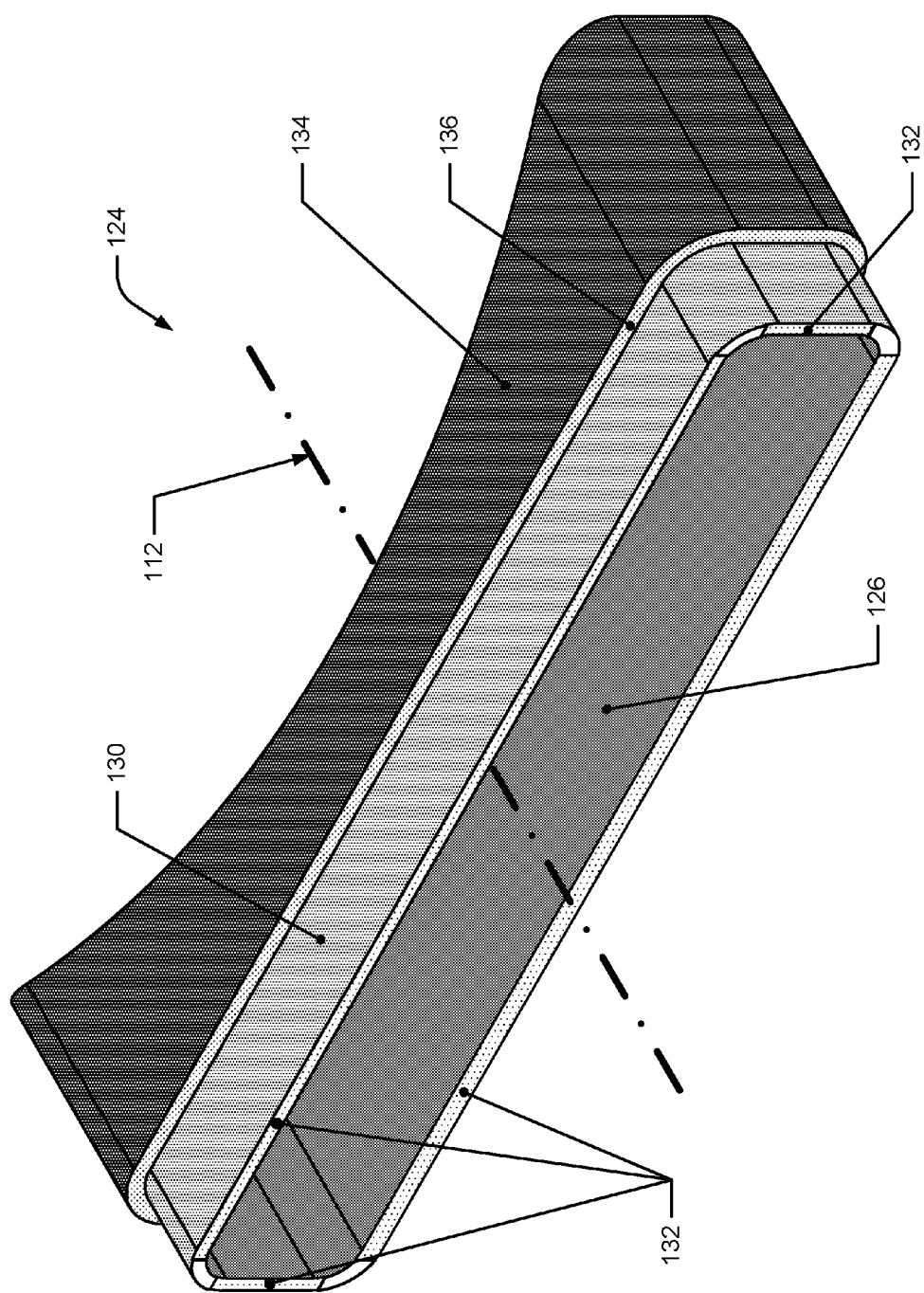
FIG. 13 depicts the insert of FIG. 12.

The first insert outer surface 130 may extend at least partially around the insert inner surface 126 when viewed along the first axis 112. FIG. 13 depicts an isometric view of the insert of FIG. 12. The first insert outer surface 130 can be seen extending around the insert inner surface 126. In some embodiments, the first insert outer surface 130 extends fully around the insert inner surface 126. In some other embodiments, the first insert outer surface 130 may extend only partially around the insert inner surface 126. In some such other embodiments, one or more portions of the first insert outer surface 130 may extend partially around the insert inner surface 126. For instance, the first insert outer surface 130 may not be a contiguous surface, in which case another surface or feature, such as one or more partitions, may cause a break or discontinuity in the first insert outer surface 130.

As can also be seen in FIG. 13, the first insert outer surface 130 may be outwardly offset from the insert inner surface 126 when viewed along the first axis 112. In some embodiments, the first insert outer surface 130 may be offset from the insert inner surface 126 by a substantially constant spacing around the insert inner surface 126, and in some other embodiments, the offset spacing may be varied around the insert inner surface 126. For example, the insert 124 depicted in FIGS. 12 and 13 includes a first insert outer surface 130 that is offset from the insert inner surface 126, when viewed along the first axis 112, by a varied spacing. See also FIG. 14, discussed hereinbelow.

Figure 21:
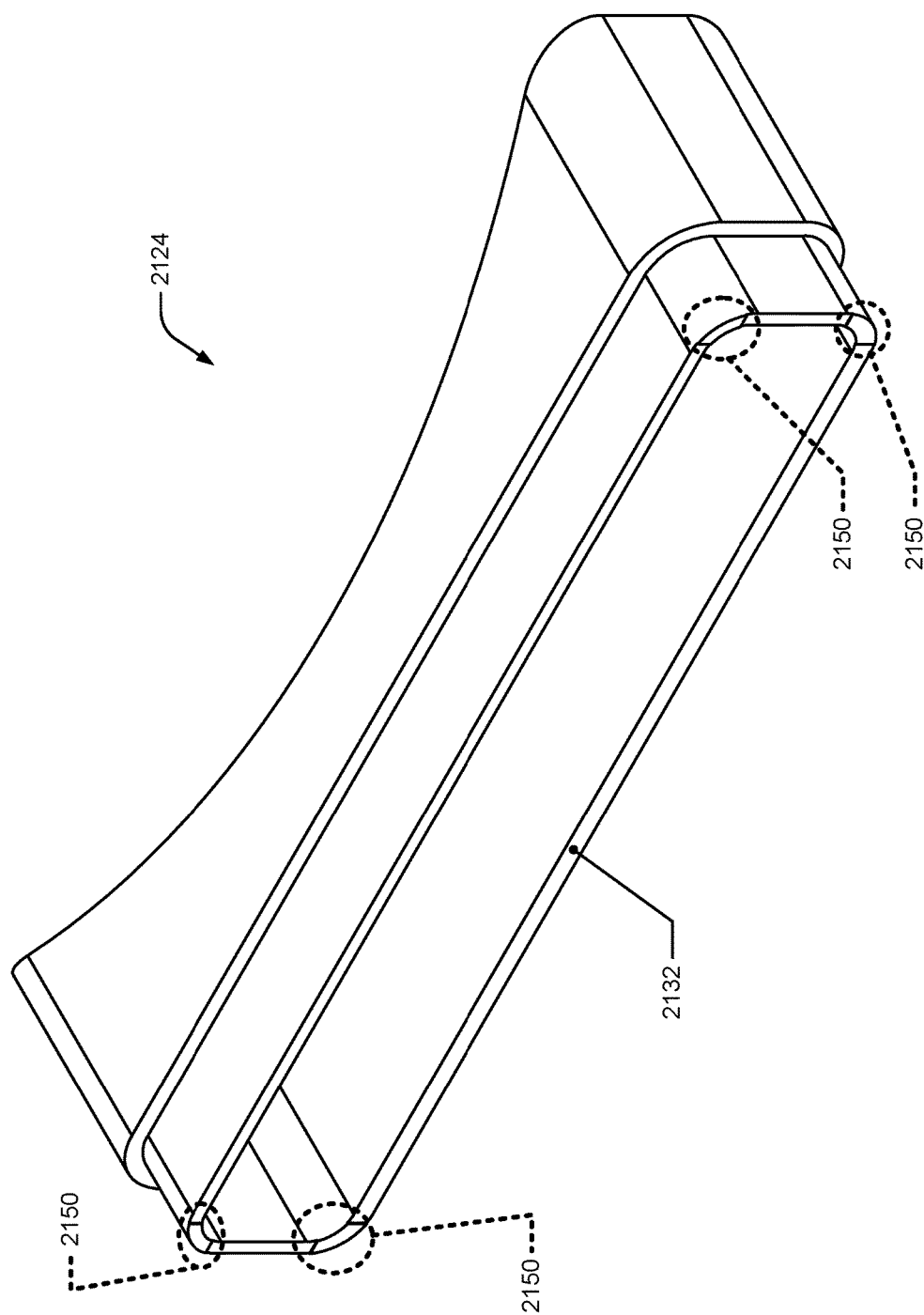
FIG. 21 depicts an isometric view of the insert of FIG. 12.

As stated above, the insert may include a front surface 132, which is identified in FIG. 13. The insert front surface 132 may be oriented normal to first axis 112, although in other implementations, the insert front surface(s) may be canted at an angle with respect to the first axis 112 (see FIG. 23, for example). In some embodiments, as depicted in FIGS. 13 and 21, the insert front surface 132 may not be a single contiguous surface, but may instead include one or more, e.g., four, subsections. In some other embodiments, the insert front surface 132 may be one contiguous surface. As discussed in greater detail below, the insert front surface 132 may also face the first wall surface 122 when the insert 124 is inserted into the chamber wall 104. "Face" in this context means that two surfaces are oriented towards each other such that a line extending from at least one point on one of the surfaces in a direction normal to that surface intersects with a point on the other surface. "Face" in this context may also include two surfaces that are parallel or substantially parallel to each other (substantially here means within 10% of parallel, e.g., +/−9° of parallel).

In some embodiments, as further depicted in FIGS. 12 and 13, the insert 124 may also include a second insert outer surface 134 which may extend at least partially around the first insert outer surface 130 and which may also be outwardly offset from the first insert outer surface 130, when viewed along the first axis 112 in a manner similar to that of the first insert outer surface 130 with respect to the insert inner surface 124. In some such embodiments, as mentioned above, one or more portions of the second insert outer surface 134 may extend partially around the first insert outer surface 130 and there may be other features or surfaces which cause one or more breaks and/or discontinuities in the second insert outer surface 134. The second insert outer surface may alternatively extend fully around the first insert outer surface 130 when viewed along the first axis 112.

In some embodiments, and as also shown in FIGS. 12 and 13, the insert 124 may also include second wall surface 136 that spans between the second insert outer surface 134 and the first insert outer surface 130. Generally speaking, the second wall surface 136 extends around the first insert inner surface 130 to the same extent as the second insert outer surface 134. In some such embodiments, e.g., embodiments where the second insert outer surface 134 extends fully around the first insert inner surface 130, the second wall surface 136 extends fully around the first insert outer surface 130.

FIG. 13 also depicts that, when viewed along the first axis 112, the second insert outer surface 134 is offset outwardly from the first insert outer surface 130. As stated above, "outwardly" means in a direction away from the first axis 112. In some embodiments, the second insert outer surface 134 may be offset from the first insert outer surface 130 by a substantially constant spacing, and in some other embodiments, the offset spacing may be varied around the first insert outer surface 130. For example, the insert 124 depicted in FIG. 13 includes a second insert outer surface 134 that is offset from the first insert outer surface 130, when viewed along the first axis 112, by a varied spacing.

Figure 14:
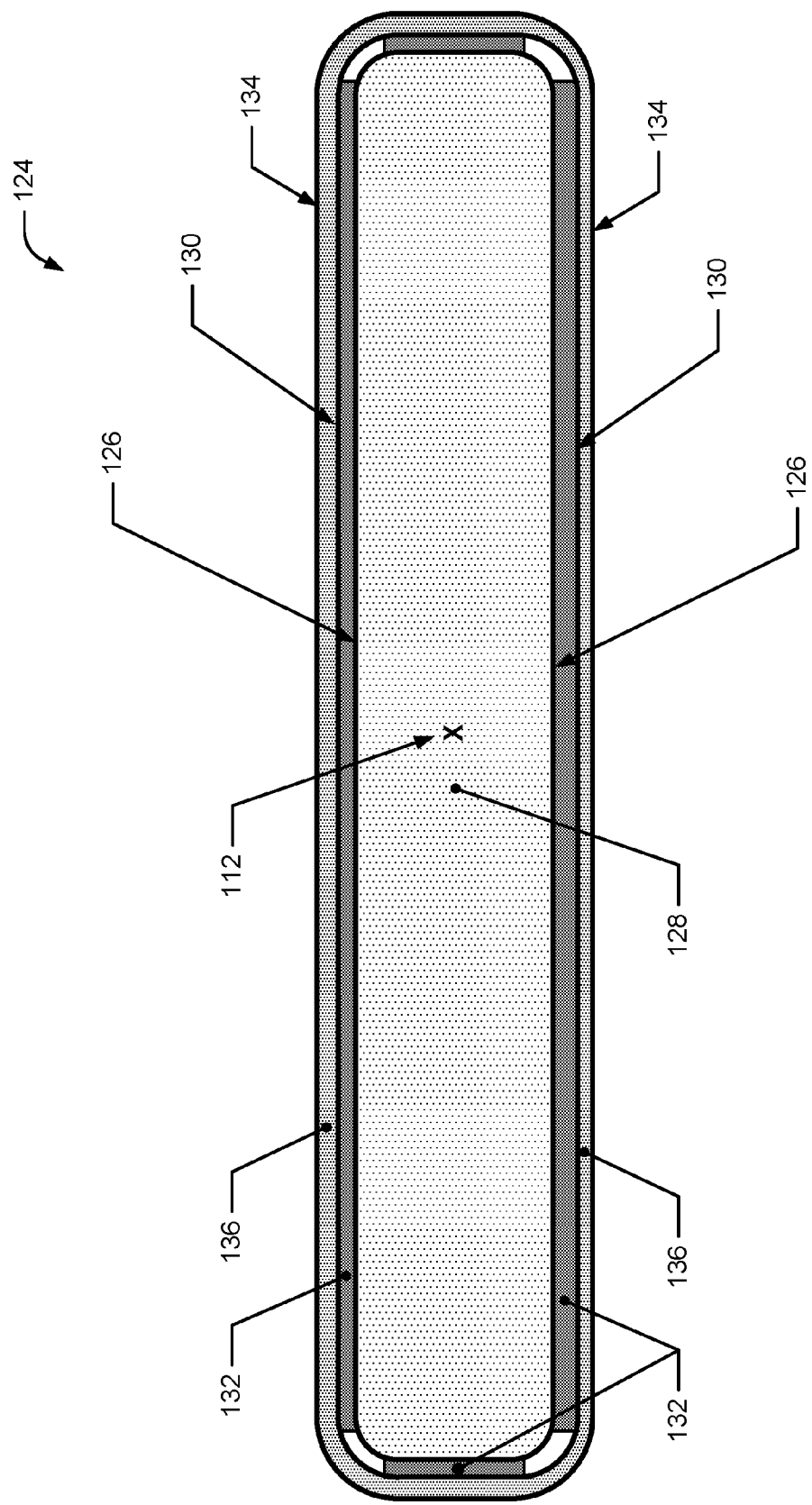
FIG. 14 depicts a front view of the insert depicted in FIG. 13.

FIG. 14 depicts a front view of the insert of FIG. 13. The view of FIG. 14 is along the first axis 112, which is identified by the "X". The insert opening 128 is identified and is perpendicular to the first axis 112. The insert inner surface 126, the first insert outer surface 130, and the second insert outer surface 134 are all seen in profile, e.g., edge-on, with the first insert outer surface 130 extending fully around and outwardly offset from the insert inner surface 126, and with the second insert outer surface 134 extending fully around and outwardly offset from the first insert outer surface 130. FIG. 14 also shows, as mentioned above, the first insert outer surface 130 offset from the insert inner surface 126, when viewed along the first axis 112, by a varied spacing. Likewise, the second insert outer surface 134 is offset from the first insert outer surface 130, when viewed along the first axis 112, by a varied spacing.

Figure 15:
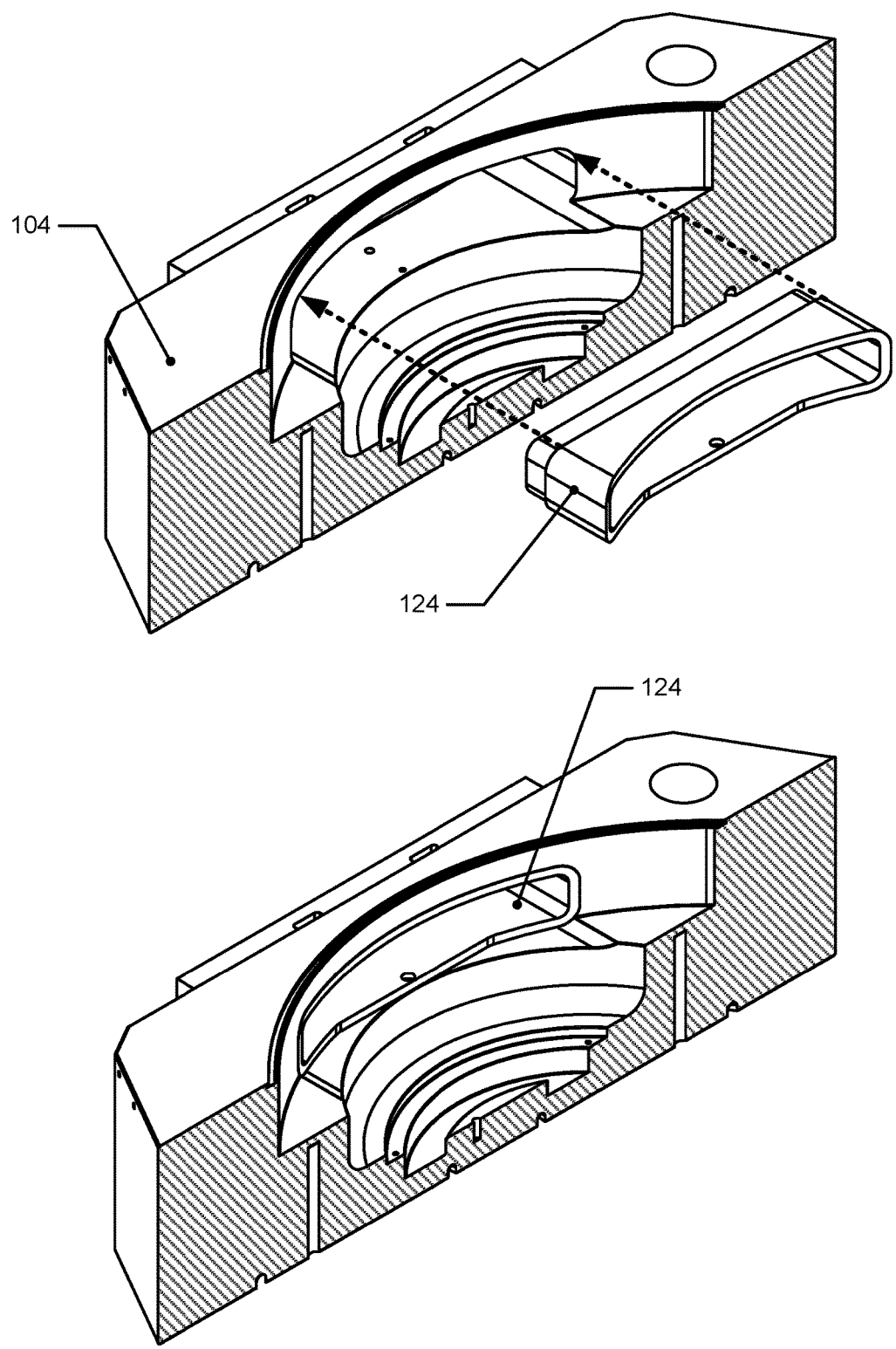
FIG. 15 depicts two off-angle views of the insertion of the insert into the wafer transfer passage of the section of chamber wall from FIG. 6.

As mentioned above, the insert 124 is inserted into at least a portion of the wafer transfer passage 108 of the chamber wall 104. FIG. 15 depicts two off-angle views of the insertion of the insert into the wafer transfer passage of the section of chamber wall from FIG. 6. The top portion of FIG. 15 shows an exploded view with the insert 124 outside but aligned with the wafer transfer passage (not identified) of the chamber wall 104. The bottom portion depicts the insert 124 located inside the wafer transfer channel (not identified) of the chamber wall 104. In some embodiments, one or more portions of the insert 124 may be located outside the wafer transfer passage 108 and/or outside the chamber wall 104.

Figure 16:
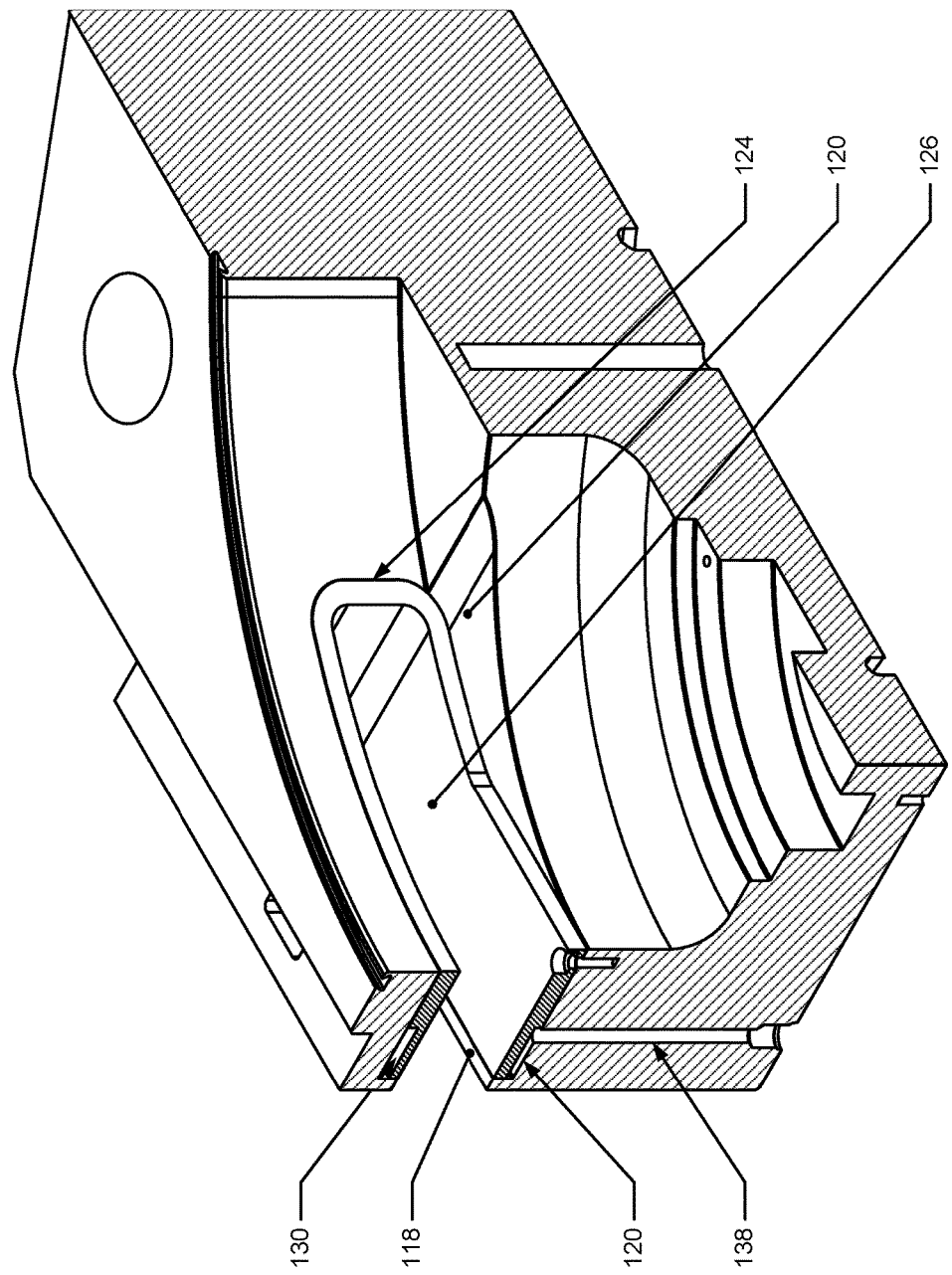
FIG. 16 depicts a cross-sectional off-angle view of a section of the processing chamber wall depicted in FIG. 15.

Additional features of the chamber wall with the insert inserted into at least a portion of the wafer transfer passage will now be discussed. FIG. 16 depicts a cross-sectional off-angle view of a section of the processing chamber wall depicted in FIG. 15; a cut has been made through the section of the processing chamber wall in order to expose an inside portion of the chamber wall, wafer transfer passage, and insert so that additional features may be discussed. As can be seen, the insert 124 is installed in the wafer transfer passage (not identified) and some of the viewable features include portions of the inner passage surface 118, the first recessed surface 120, the insert inner surface 126, a first insert outer surface 130, and a gas inlet 138. The gas inlet 138 may extend through a portion of the chamber wall 104 and may extend through the first recessed surface 120 as shown in FIG. 16. In some embodiments, the gas inlet 138 may connect to a gas supply which may include a purge gas supply. In some embodiments, the insert 124 is located within the wafer transfer passage 108 between the gate valve (not shown) and the interior volume 106.

Figure 17:
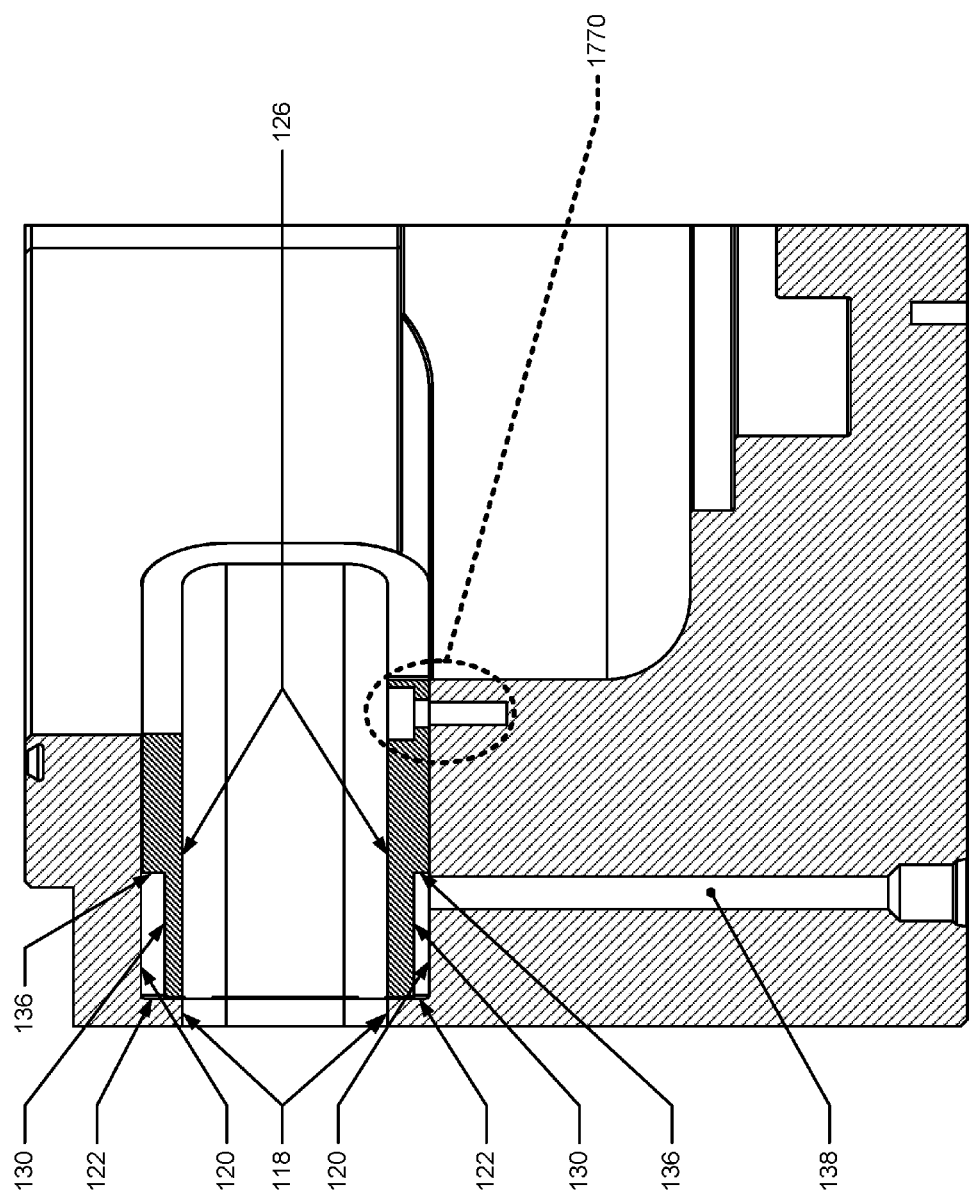
FIG. 17 depicts a cross-sectional side view of the section of processing chamber wall in FIG. 16.

FIG. 17 depicts a cross-sectional side view of the section of processing chamber wall in FIG. 16. In FIG. 17, the gas inlet 138 is identified along with portions of the first recessed surface 120, the first wall surface 122, the first insert outer surface 130, the second wall surface 136, and the insert inner surface 126. As discussed in more detail below, a gas distribution channel (not identified here) is at least partially defined by the first recessed surface 120, the first insert outer surface 130, and the first wall surface 122. In some embodiments and as shown in FIG. 17, the gas distribution channel is further partially defined by the second wall surface 136. The gas distribution channel may also be fluidically connected to the gas inlet 138 such that gas may flow from the gas inlet 138 into the gas distribution channel. It should be understood that the gas inlet 138 may be configured to flow any suitable gas or liquid into the gas distribution channel.

Figure 18:
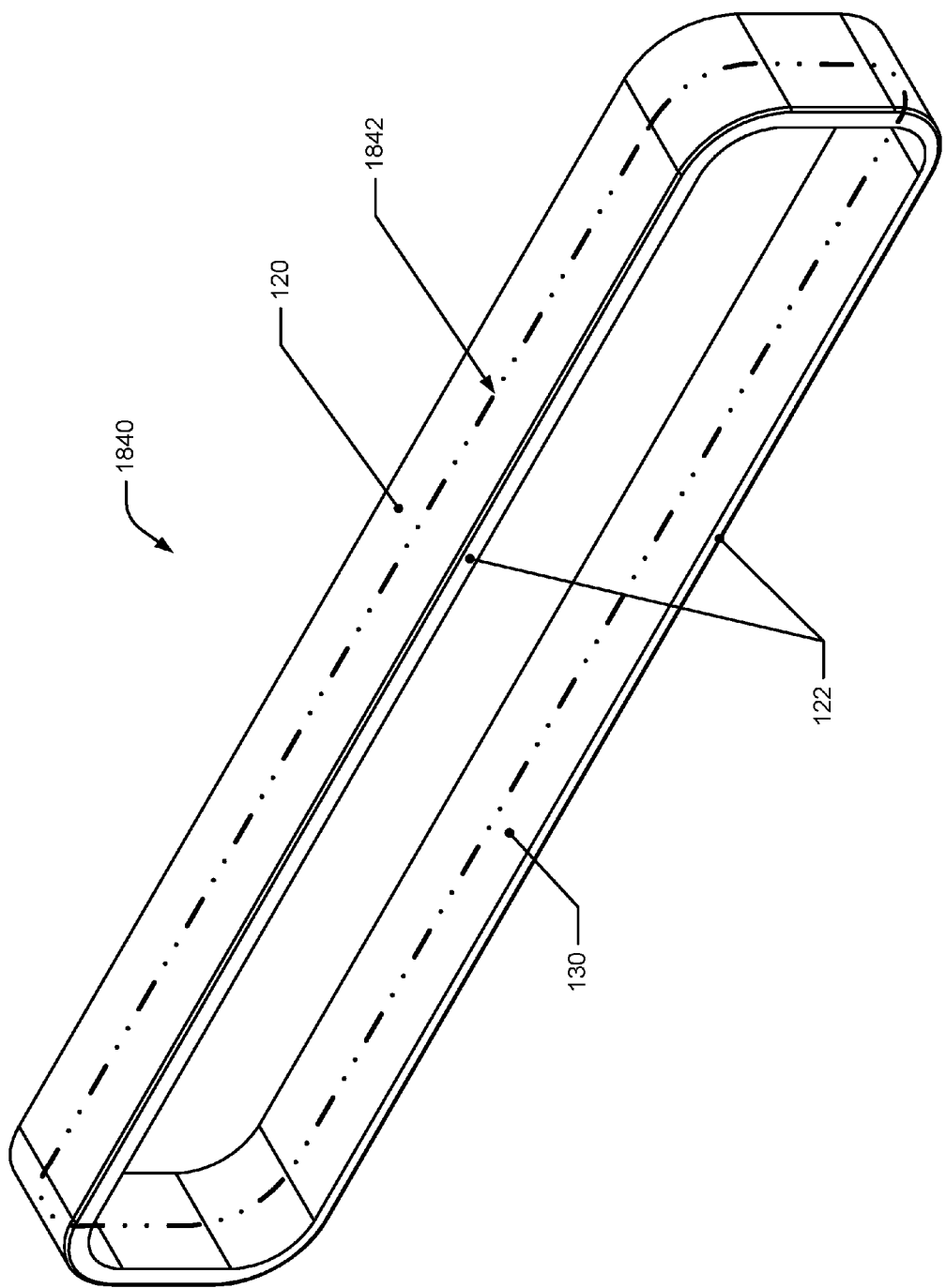
FIG. 18 depicts an isometric view of the volumetric representation of the gas distribution channel.

FIG. 18 depicts an isometric view of the volumetric representation of the gas distribution channel. In FIG. 18, the volumetric representation of the gas distribution channel 1840 is generally depicted and the surfaces that at least partially bound the gas distribution channel 1840 are identified. As shown, the first wall surface 122 bounds the front of the gas distribution channel 1840, the first recessed surface 120 bounds the outward, circumferential portion of the gas distribution channel 1840, and the first insert outer surface 130 bounds the inward, circumferential portion of the gas distribution channel 1840.

Figure 19:
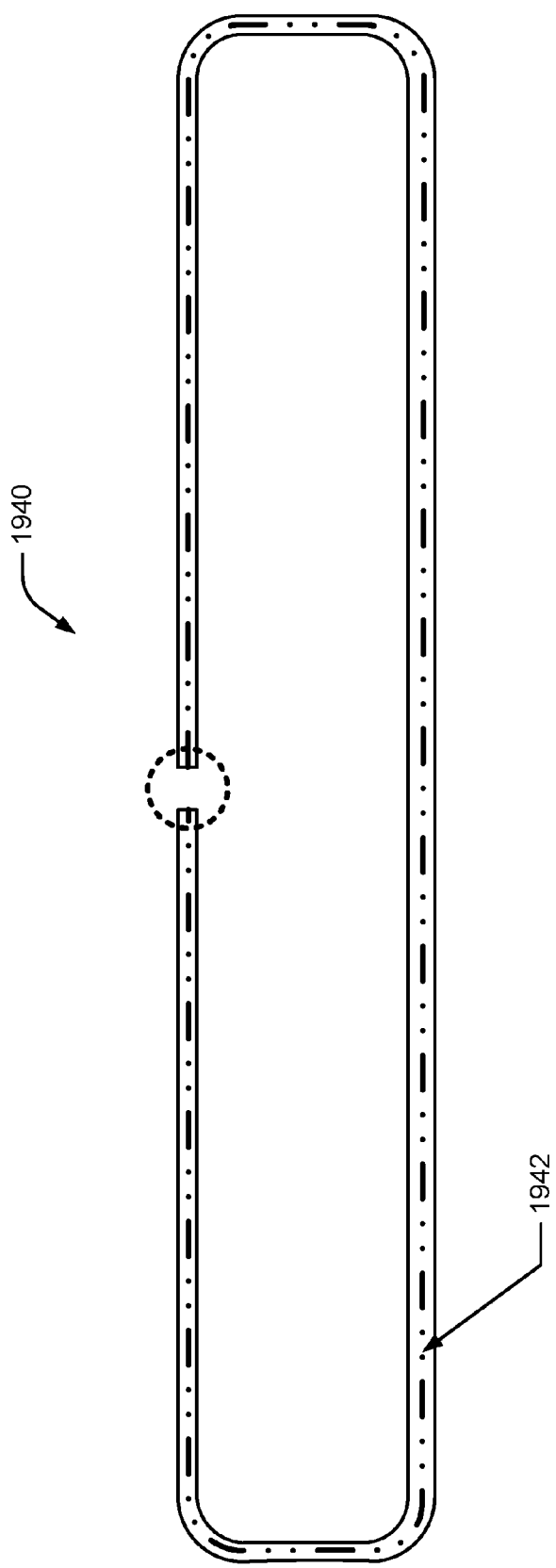
FIG. 19 depicts a side view of a gas distribution channel that follows a first path that extends partially around the insert inner surface.

In some embodiments, the gas distribution channel 1840 may follow a first path 1842 that extends at least partially around the insert inner surface. FIG. 18 further depicts the first path 1842 which is shown with a dashed-and-double-dotted line. In some embodiments, as shown in FIG. 18, the first path 1842 for the gas distribution channel 1840 extends fully around the insert inner surface 126 (not shown in FIG. 18). In some other embodiments in which the first path extends partially around the insert inner surface, there may be one or more breaks in the first path which prevent the first path from extending fully around the insert inner surface. For instance, there may be one or more surfaces or features which block the gas distribution passage in one location, thereby breaking the first path and creating two separate sections of the gas distribution passage. This may create a "C-shape" gas distribution channel. In another example, a break in the first path may occur at the midpoint of the first path which may be at an equal distance away from the gas inlet. FIG. 19 depicts a side view of a gas distribution channel that follows a first path that extends partially around the insert inner surface. As can be seen, the gas distribution channel 1940 follows a first path 1944 that has a break, identified within the dotted circle, which causes the first path 1944 not to extend fully around the insert inner surface. This break may be caused, for example, by a wall that interrupts the first insert outer surface; the top of such a wall may be flush with the second insert outer surface, and the wall may extend from the insert front surface to the second wall surface.

Figure 20:
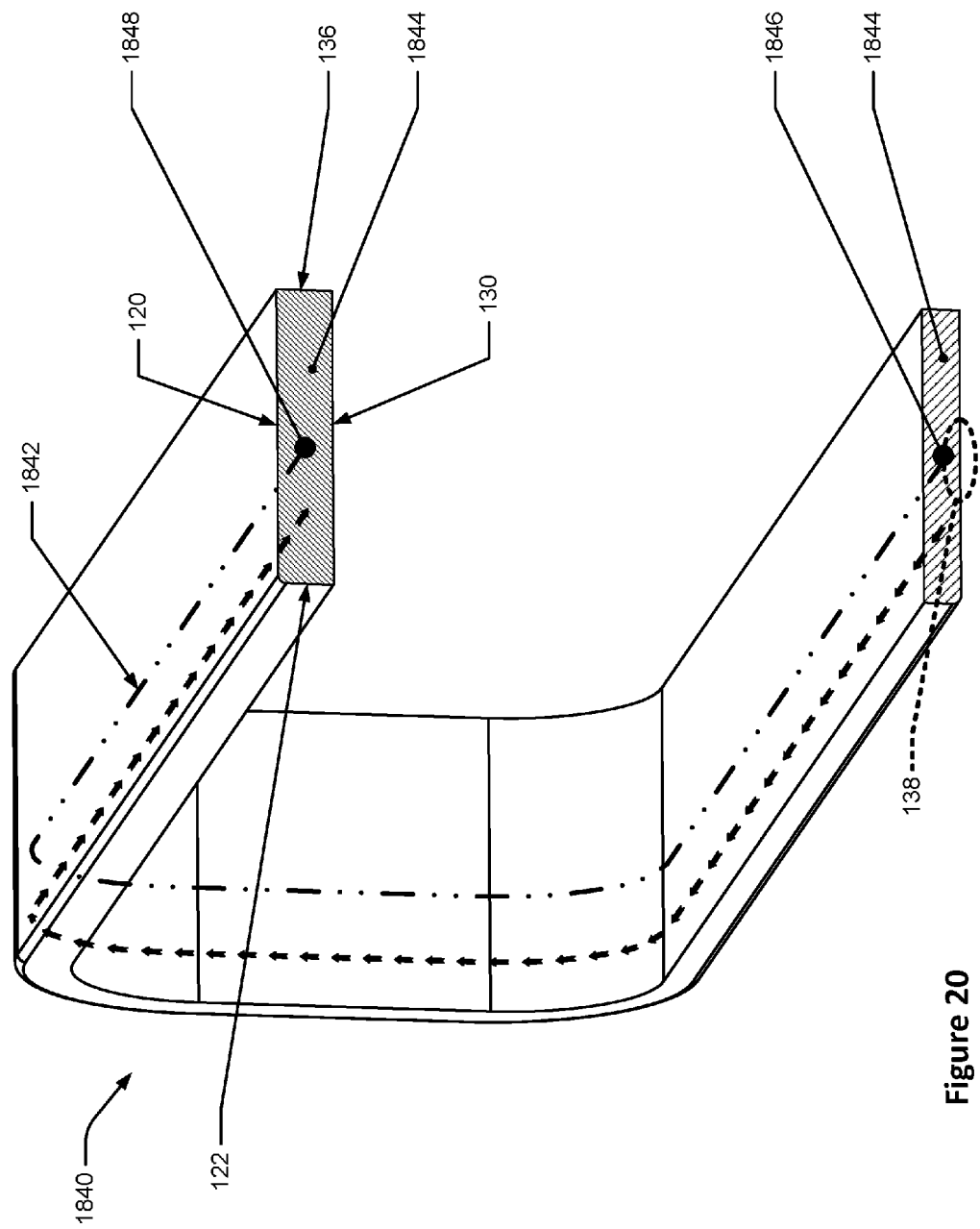
FIG. 20 depicts a cross-sectional off-angle view of the volumetric representation of the gas distribution channel in FIG. 18.

The gas distribution channel 1840 may have a third cross-sectional area that is perpendicular to the first path 1842. FIG. 20 depicts a cross-sectional off-angle view of the volumetric representation of the gas distribution channel in FIG. 18. The four surfaces that bound the gas distribution channel 1840, the first wall surface 122, the first recessed surface 120, the first insert outer surface 130, and the second wall surface 136, along with the gas inlet 138 are identified. The third cross-sectional area 1844 of the gas distribution channel 1840 can also be seen in FIG. 20 and is perpendicular to the first path 1842. In some embodiments, the third cross-sectional area 1844 remains substantially constant along the first path 1842. Substantially here means within 10% of the average third cross-sectional area along the first path 1842. In some other embodiments, the third cross-sectional area 1844 may vary along the first path 1842. In some such embodiments, the third cross-sectional area 1844 may have two or more different cross-sectional areas, or smoothly transition between two or more different cross-sectional areas. In some embodiments, the third cross-sectional area 1844 may also be substantially rectangular, similar to the first and second cross-sectional areas, in that one or more corners may be rounded. For instance, the third cross-sectional area 1844 in FIG. 20 has one rounded corner. In some other embodiments, the third cross-sectional area 1844 may be other geometrical shapes, including, for instance, a trapezoid.

In some embodiments, the third cross-sectional area may be larger at at least one point along the first path than at another point along the first path. For example, the first path may have a first point and a second point such that the first point is closer to the gas inlet along the first path than the second point. In some such embodiments, the first point may be the closest point to the gas inlet while the second point is the farthest point along the first path from the gas inlet. In some embodiments, the third cross-sectional area at the second point may be larger than the third cross-sectional area at the first point.

Referring back to FIG. 20, a first point 1846 of the first path 1842 and a second point 1848 of the first path 1842 are identified and although not shown in the Figure, the gas inlet is closer along the first path 1842 to the first point 1846 than to the second point 1848 such that gas may flow from the first point 1846 in the direction of the black arrows towards the second point 1848. As can be seen in FIG. 20, the third cross-sectional area 1844 at the second point 1848 is larger than the third cross-sectional area 1844 at the first point 1846. In some embodiments, the first path 1842 may have additional points at which the third cross-sectional area 1844 is larger than, smaller than, or substantially the same as at one or more other points. For instance, the third cross-sectional area 1844 may be substantially constant (e.g., within 10% of the cross sectional area) for a section along the first path 1842, then gradually increase in size along the first path 1842, and then remain substantially constant for a different section along the first path 1842.

When the insert is inserted into at least a portion of the wafer transfer passage, the insert and/or the wafer transfer passage are configured to create a gap between the first wall surface of the wafer transfer passage and the front surface of the insert. FIG. 21 depicts an isometric view of the insert of FIG. 12. In some embodiments, the insert 124 may include one or more spacers, like in FIG. 21. Here, the insert 2124 includes four spacers 2150 which are identified within the dotted ellipses. The spacers 2150 may contact the first wall surface of the wafer transfer passage (not shown) in order to space the insert front surface 2132 away from the first wall surface by a first gap distance. The first gap distance may range between about 0.005 inches and about 0.040 inches. For example, the first gap distance may be about 0.010 inches. In some embodiments, the first gap distance may be substantially constant (within 10% of the other first gap distances) while in some other embodiments, the first gap distance may vary along the insert front surface 2132.

In some embodiments, such as in FIG. 21, the spacers 2150 extend from the insert front surface 2132. FIG. 21 depicts the insert of FIG. 12. In some such embodiments, spacers may also or alternatively extend from a surface of the wafer transfer passage.

Figure 22:
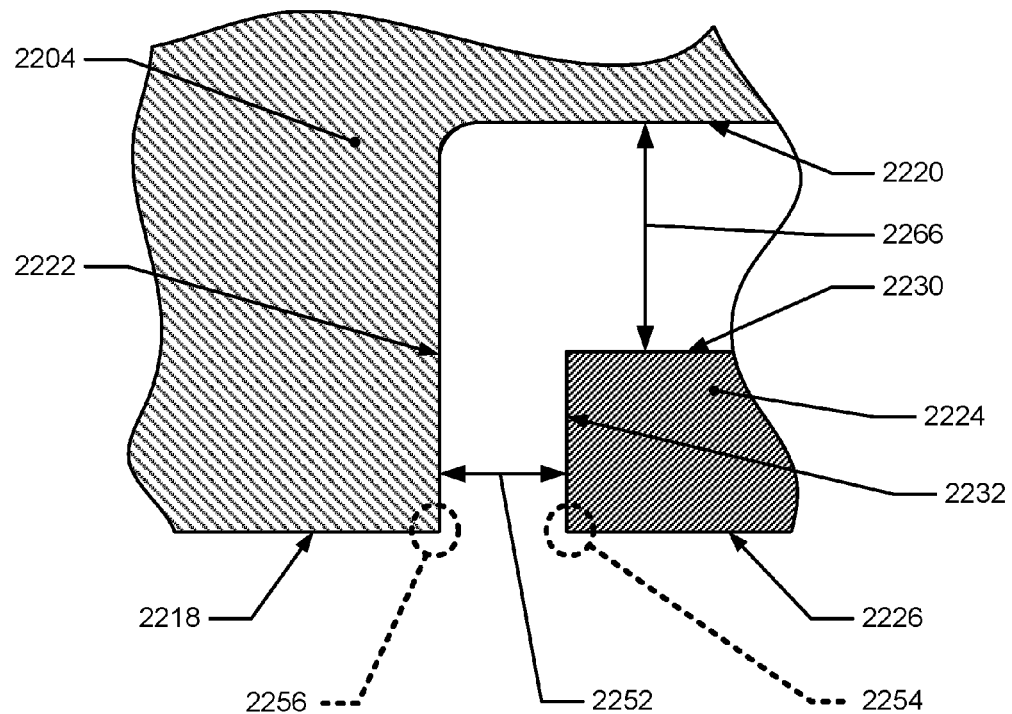
FIG. 22 depicts a partial cross-sectional side view of one example section of chamber wall and insert similar to that depicted in FIG. 17.
Figure 23:
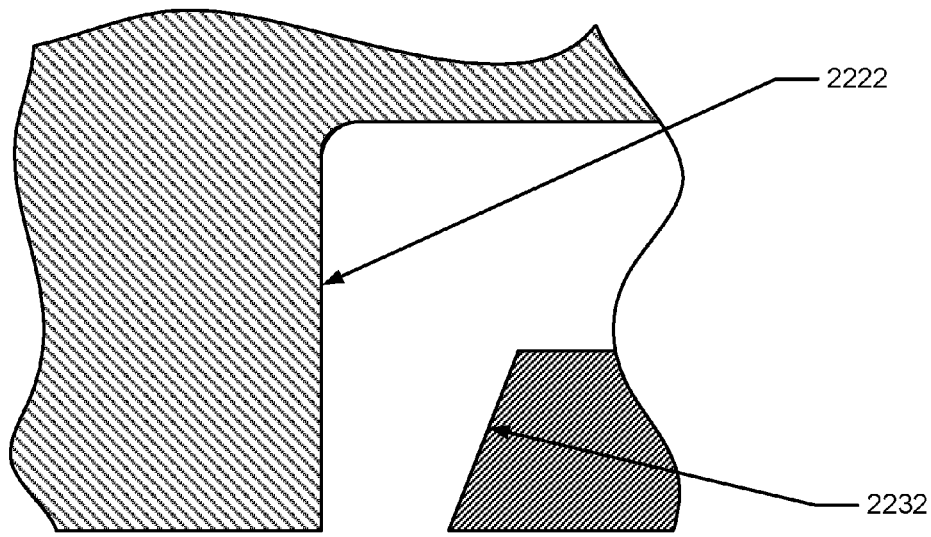
FIG. 23 depicts a partial cross-sectional side view of the section of chamber wall similar to that depicted in FIG. 22.

FIG. 22 depicts a partial cross-sectional side view of one example section of chamber wall and insert similar to that depicted in FIG. 17. As can be seen, a portion of the chamber wall 2204 and the insert 2224 are oriented such that the insert front surface 2232 is separated from the first wall surface 2222 by a first gap distance 2252. The first gap distance 2252 may be measured from any point along the insert front surface 2232. As mentioned above, the insert front surface 2232 and the first wall surface 2222 may be substantially parallel to each other, as can be seen in FIG. 22. In some embodiments, the insert front surface 2232 and the first wall surface 2222 may be normal or substantially normal to the first axis (not shown). The insert front surface 2232 and the first wall surface 2222 may also be at an oblique angle to each other. In some such embodiments, the first wall surface 2222 may be normal to the first axis while the front wall surface 2232 is at an oblique angle to the first wall surface 2222 as, for instance, shown in FIG. 23. FIG. 23 depicts a partial cross-sectional side view of the section of chamber wall similar to that depicted in FIG. 22. In some other embodiments, the front wall surface 2232 may be normal to the first axis while the first wall surface 2222 is at an oblique angle to the front wall surface 2232. In some other embodiments, neither surface may be normal to the first axis, but such surfaces may still be at an oblique angle to each other. In all such embodiments, the first wall surface 2222 and the front wall surface 2232 may be considered to face each other, which may include being parallel to each other.

The first recessed surface may also be separated from the first insert outer surface by a first distance, for example, as shown in FIG. 22. The first distance 2266 can be seen between the first recessed surface 2220 and the first insert outer surface 2230. As discussed below, this distance may vary, but in some implementations it may range between about 0.010 inches to about 0.50 inches, and may also be about 0.200 inches. Although discussed in connection with FIG. 22, the first distance may separate the first recessed surface 2220 and the first insert outer surface 2230 in any of the other embodiments discussed and shown herein, such as depicted in at least FIGS. 16 and 17. Furthermore, the first distance may provide one dimension of the third cross-sectional area, discussed herein.

A first edge where the insert front surface and the insert inner surface meet may be sharp, rounded, or chamfered. Referring back to FIG. 22, the first edge 2254 where the insert front surface 2232 and the insert inner surface 2226 meet is identified within a dotted circle. As depicted, the first edge 2254 is at a substantially 90 degree angle, i.e. "sharp" (substantially means within +/−5 degrees of perpendicular). In some embodiments, the first edge 2254 may also be at an obtuse or acute angle, and in some other embodiments, may be rounded or chamfered. Likewise, a second edge 2256 where the first wall surface 2222 and the inner passage surface 2218 meet may be similarly configured as the first edge 2254.

Figure 24:
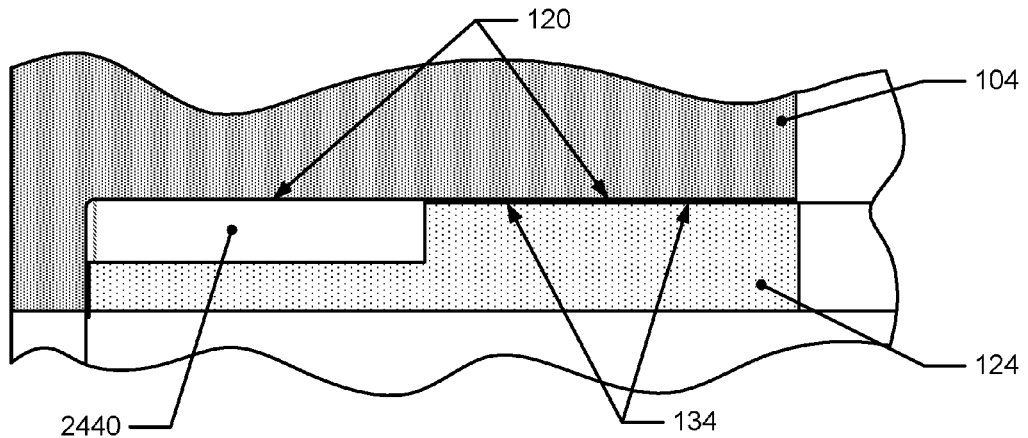
FIG. 24 depicts an enlarged cross-sectional side view of a portion of the chamber wall and insert depicted in FIG. 17.

In some embodiments, when the insert is inserted into at least a portion of the wafer transfer passage, the second insert outer surface may be proximate to the first recessed surface. FIG. 24 depicts an enlarged cross-sectional side view of a portion of the chamber wall and insert depicted in FIG. 17. As can be seen, portions of the chamber wall 104 and wafer transfer passage (not identified), are shown with dark shading instead of cross-hatching for clarity purposes, and the insert 124, is identified with light shading instead of cross-hatching for clarity purposes, inserted into at least a portion of the wafer transfer passage. The first recessed surface 120 and the second insert outer surface 134 are seen as proximate to each other. In some embodiments, the first recessed surface 120 and the second insert outer surface 134 may be touching each other such that they are fluidically sealed with each other. In some other embodiments, some material or spacer may be placed in between the first recessed surface 120 and the second insert outer surface 134. In some embodiments, the chamber wall 124, including the wafer transfer passage, and the insert 104 are configured such that gas and/or fluid in the gas distribution channel, a cross-section of which is identified as 2440, does not travel between a space that may exist between the first recessed surface 120 and the second insert outer surface 134.

Figure 25:
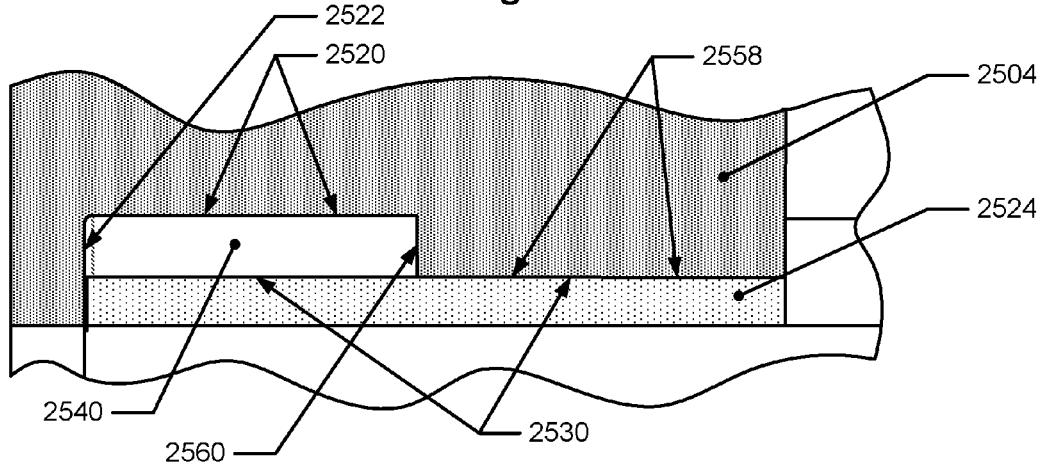
FIG. 25 depicts an enlarged cross-sectional side view of a portion of a similar chamber wall and insert to that depicted in FIG. 17.

In some embodiments, the wafer transfer passage may include a second recessed surface that extends around the inner passage surface and is inwardly offset from the first recessed surface when viewed along the first axis. The phrase "inwardly" means closer to the first axis. FIG. 25 depicts an enlarged cross-sectional side view of a portion of a similar chamber wall and insert to that depicted in FIG. 17. As can be seen in FIG. 25, the wafer transfer passage of the chamber wall 2504 includes a second recessed surface 2558 and a third wall surface 2560 that extends between the first recessed surface 2520 and the second recessed surface 2558. In some such configurations, like that depicted in FIG. 25, the insert 2524 may not include a second insert outer surface and may only have a first insert outer surface 2530. The insert 2524 and the wafer transfer passage may be configured such that the second recessed surface 2558 is proximate to the first insert outer surface 2530, like that shown in FIG. 25. Similar to the discussion above, in some embodiments a spacer or material may be placed between these two surfaces. Furthermore, in some such embodiments, the gas distribution passage, a cross-section of which is identified as 2540, may be partially defined by at least the third wall surface 2560, the first insert outer surface 2530 and the first wall surface 2522, and such gas distribution channel may be configured similarly to the above discussion.

Figure 26:
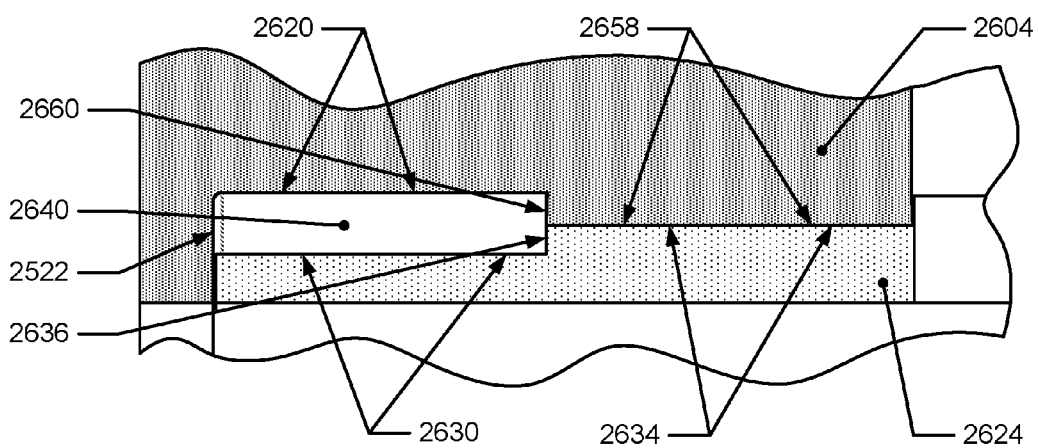
FIG. 26 depicts an enlarged cross-sectional view of a portion of a similar chamber wall and insert to that depicted in FIG. 17.

In some such embodiments in which the wafer transfer passage may include a second recessed surface that extends around the inner passage surface and is inwardly offset from the first recessed surface when viewed along the first axis, the insert may also include a second outer surface as previously discussed. FIG. 26 depicts an enlarged cross-sectional side view of a portion of a similar chamber wall and insert to that depicted in FIG. 17. As can be seen, the wafer transfer passage of the chamber wall 2604 includes a second recessed surface 2658 and a third wall surface 2660 that extends between the first recessed surface 2620 and the second recessed surface 2658. Similar to previously discussed, the insert 2624 includes a second insert outer surface 2634 which may extend at least partially around the first insert outer surface (not shown) and which may also be outwardly offset from the first insert outer surface, in a manner similar to that of the first insert outer surface with respect to the insert inner surface 124, and includes a second wall surface 2636 that extends between the second insert outer surface 2634 and the first insert outer surface 2630. In some such embodiments, the second recessed surface 2658 may be proximate to the second insert outer surface 2634, as previously discussed above.

Additionally, in some such embodiments, the gas distribution passage, a cross-section of which is identified as 2640, may be partially defined by at least the third wall surface 2660, the second wall surface 2636, the first insert outer surface 2630, the first recessed surface 2620 and the first wall surface 2622, and such gas distribution channel may be configured similarly to the above discussion.

In some embodiments, the insert may be made of two or more parts such that when assembled, the two or more parts form, in the aggregate at least one or more surfaces of the insert which may include the insert inner surface, the first insert outer surface, the insert front surface, the second insert outer surface, and the second wall surface. In some embodiments, the insert may be made from various materials including, but not limited to, a ceramic, nickel plated aluminum, and stainless steel.

Figure 27:
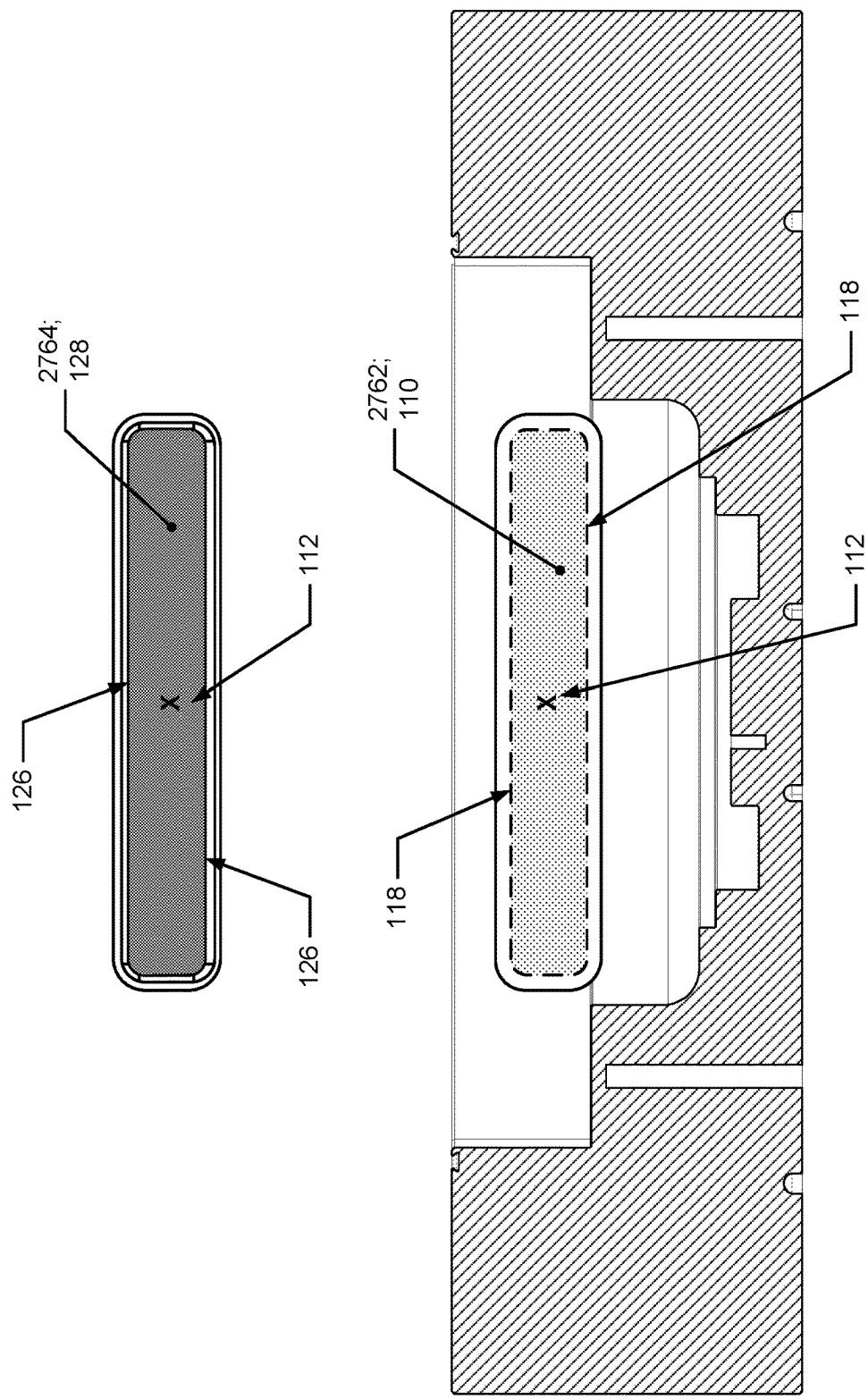
FIG. 27 depicts an elevated view of the back of the section of the processing chamber in FIG. 10 along with a plan front view of the insert in FIGS. 13 and 14.

In some embodiments, the first cross-sectional area may be substantially equal in size to the second cross-sectional area. Substantially equal means within 10% of the second cross-sectional area. In some such embodiments, the first cross-sectional area may be substantially equal in size and shape to the second cross-sectional area. For instance, FIG. 27 depicts an elevated view of the back of the section of the processing chamber in FIG. 10 along with a plan front view of the insert in FIGS. 13 and 14. The inner passage surface 118, identified with a dashed line, which defines the opening with the first cross-sectional area 2762, and the insert inner surface 126 that defines the insert opening with the second cross-sectional area 2764, are identified in FIG. 27. The viewing angle of FIG. 27 is along the first axis 112 which is again identified by the "X". The first cross-sectional area 2762 and the second cross-sectional area 2764 may both be perpendicular to the first axis 112. As can also be seen from the viewing angle of FIG. 27, the opening 110 is the same area as the first cross-sectional area 2762 and the insert opening is the same area as the second cross-sectional area 2764. In FIG. 27, the first cross-sectional area 2762 and the second cross-sectional area 2764 are also substantially equal in size and shape. The first cross-sectional area and/or the second cross-sectional area may, in some embodiments, vary in size along the first axis and may, in some embodiments, remain constant along the first axis.

In some embodiments, the inner passage surface may be aligned with the insert inner surface. Referring back to FIG. 17, the inner passage surface 118 and the insert inner surface 126 can both be seen and, as depicted, these two surfaces are aligned with each other. FIG. 16 also shows the inner passage surface 118 and the insert inner surface 126 aligned with each other. Such an alignment may be an alignment with respect to the first axis and/or with respect to each other.

As described above, when the insert is inserted into the wafer transfer passage, a gas distribution channel is defined, i.e. created, by at least some surfaces of the insert and the wafer transfer passage. The gas distribution channel is also fluidically connected to the gas inlet such that gas may flow from the gas inlet and into the gas distribution passage. The insert and the wafer transfer passage are also configured to enable the gas in the gas distribution passage to flow through the gap created between the first wall surface and the insert front surface. The insert and the wafer transfer passage may be configured to enable the gas to flow through the subject gap in a generally uniform and/or evenly distributed manner. In some such implementations, the flow may be a uniform sheet of flow. It should be noted that the gas does not flow out of the gas distribution channel through any nozzles, but rather flows through the linear gap, which avoids creating point-jets that may result in non-uniform flow effects.

Figure 28:
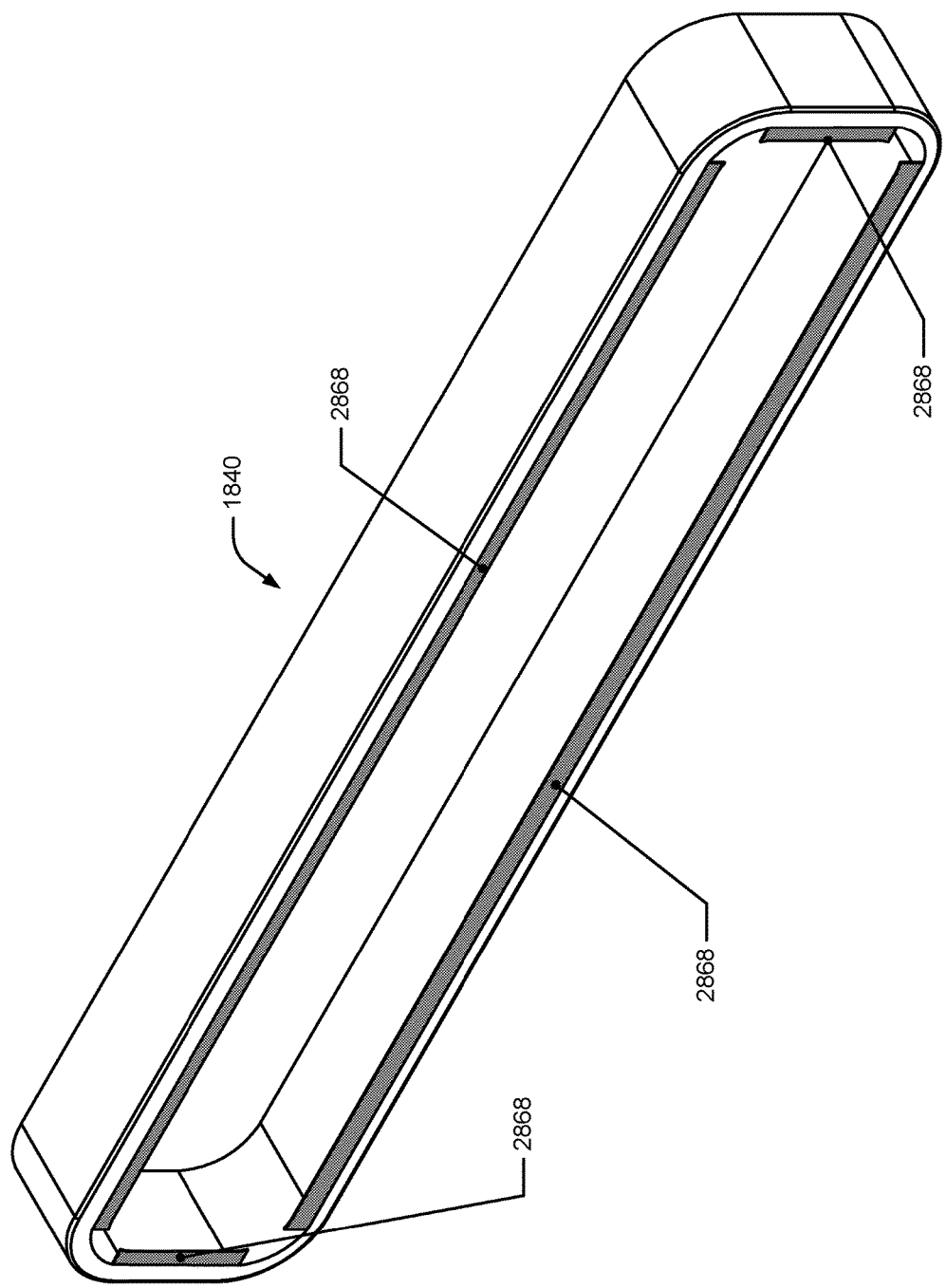
FIG. 28 depicts an isometric view of a volumetric representation of the gas distribution channel similar to FIG. 18.
Figure 29:
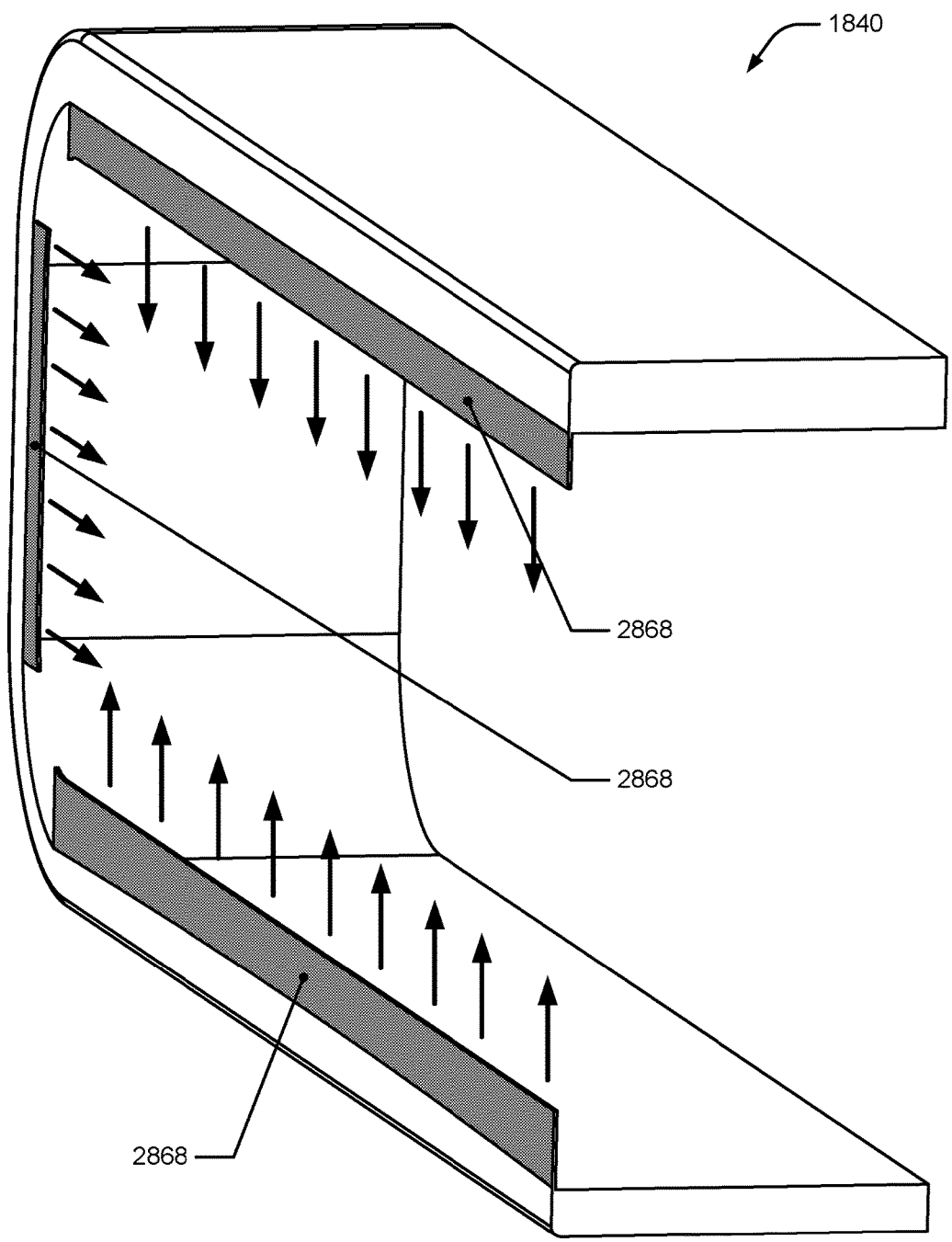
FIG. 29 depicts an off-angle cross-sectional view of the volumetric representation of the gas distribution channel of FIG. 28.

FIG. 28 depicts an isometric view of a volumetric representation of the gas distribution channel similar to FIG. 18. The gas distribution channel 1840 is seen along with a shaded volume 2868 representational of the gas flowing through the gap between the first wall surface 122 (not shown) and the insert front surface 132 (not shown). FIG. 29 depicts an off-angle cross-sectional view of the volumetric representation of the gas distribution channel of FIG. 28. As can be seen, the shaded area representational of the gas flowing through the gap 2868 is a thin planar jet of gas. This representational area, as indicated by the arrows, is intended to show at least a general direction of the gas flowing through the subject gap, which may be considered in a planar jet or "sheet", and is not intended to depict the actual gas flow paths. In some embodiments, the spacers between the insert and the wafer transfer passage may block some gas flow between the gap. For instance, in FIG. 28 the areas where gas is not flowing from the gas distribution passage, e.g., the corners, are the areas in which the spacers are located within the insert 124. In some such embodiments, the insert and wafer transfer passage may be configured to enable gas to be evenly distributed within the wafer transfer passage.

The third cross-sectional area, i.e. the cross sectional area of the gas distribution channel, and/or the gap may also be configured to enable gas to flow into the gas distribution channel and exit through the gap at a relatively even flow rate around the inner insert surface. Such configurations may vary numerous aspects of the embodiments discussed herein including, but not limited to, one or more dimensions of the third cross-sectional area, the first gap distance, the angle of the insert front surface, and the variance of the third cross-sectional area along the first path. Such configurations may also be based upon numerous factors including, but not limited to, the temperature and pressure of the purge gas, the process chemistry, the temperature and pressure of the processes gases, and the temperature and pressure of the processing chamber.

In some implementations of the present disclosure, the insert may be inserted and affixed to the chamber wall, such as by brazing or mechanical means like screws. For instance, in FIG. 17, the chamber wall and the insert include securement areas 1770, identified with a dotted circle, to receive a screw that may attach the insert to the chamber wall.

The semiconductor processing tool that may include this subject processing chamber may cause gas to flow into the gas distribution channel during one or more stages of semiconductor processing. In some such implementations, the gas may flow through the subject gap constantly, while in some other such implementations gas may flow through the gap when process chemistry is present in the processing chamber, and/or possibly during wafer transfer through the wafer transfer passage.

Another embodiment of the present disclosure is a kit that includes a semiconductor processing chamber and an insert. The semiconductor processing chamber of the kit may include an interior volume for semiconductor processing, a chamber wall that at least partially bounds an outside of the semiconductor processing chamber and the interior volume, and a wafer transfer passage that extends through the chamber wall along a first axis from the outside of the semiconductor processing chamber to the interior volume. The wafer transfer passage may have an inner passage surface with a first substantially rectangular cross-sectional area perpendicular to the first axis, a first recessed surface that extends around and is outwardly offset from the inner passage surface when viewed along the first axis, and a first wall surface that extends between the inner passage surface and the first recessed surface, and a gas inlet fluidically connected to the first recessed surface. The insert of the kit may include an opening with a second rectangular cross-sectional area perpendicular to a second axis that is defined by an insert inner surface, a first insert outer surface that extends at least partially around and is outwardly offset from the insert inner surface when viewed along the first axis, and an insert front surface. The insert and the semiconductor processing chamber of the kit may be configured such that at least part of the insert is configured to be installed inserted in at least part of into the wafer transfer passage, the chamber wall is configured to have at least part of the insert installed inserted into in at least part of the wafer transfer passage, and when at least part of the insert is installed in at least part of the wafer transfer passage: the first recessed surface, the first insert outer surface, and the first wall surface at least partially define a gas distribution channel, the gas distribution channel that is fluidically connected to the gas inlet, the first recessed surface is separated from the first insert outer surface by a first distance, and the insert front surface is separated from the first wall surface by a first gap distance.

It should be noted that the semiconductor processing chamber and the insert of the kit may include all of the features and limitations, and may be configured, as discussed and shown herein above with respect to any other inserts and semiconductor processing chambers and such discussions and Figures are herein incorporated and applied by reference to such items.

The inventors have discovered numerous benefits with this apparatus over the current techniques. For instance, the apparatuses and methods discussed herein do not increase the chamber foot print, do not need additional sealing O-rings, require limited or no service once the insert is installed into the wafer transfer passage, and the gas flowing through the gap may create a heat transfer barrier between high temperatures in the process chamber and the valve. Additionally, the present apparatus may prevent debris and particulates generated during semiconductor processing from exiting the process chamber through the wafer transfer passage.

Unless the context of this disclosure clearly requires otherwise, throughout the description and the embodiments, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein. Unless otherwise specified, the term "substantially" refers to within +/−5% of the value indicated. For example, "substantially parallel" means +/−5% of the angular range between 0° and 90°.

The invention claimed is:

1. A semiconductor processing chamber comprising:
   an interior volume for semiconductor processing;
   a chamber wall that at least partially bounds an outside of the semiconductor processing chamber and the interior volume;
   a wafer transfer passage that extends through the chamber wall along a first axis from the outside of the semiconductor processing chamber to the interior volume and has:
      an inner passage surface that defines an opening with a first substantially rectangular cross-sectional area perpendicular to the first axis,
      a first recessed surface that extends at least partially around and is outwardly offset from the inner passage surface when viewed along the first axis, and
      a first wall surface that extends between the inner passage surface and the first recessed surface;
   an insert that includes:
      an insert inner surface that defines an insert opening with a second substantially rectangular cross-sectional area perpendicular to the first axis,
      a first insert outer surface that extends at least partially around and is outwardly offset from the insert inner surface when viewed along the first axis, and
      an insert front surface that faces the first wall surface; and
   a gas inlet,
   wherein:
      the first recessed surface, the first insert outer surface, and the first wall surface at least partially define a gas distribution channel,
      the gas distribution channel is fluidically connected to the gas inlet,
      the first recessed surface is separated from the first insert outer surface by a first distance, and
      the insert front surface is separated from the first wall surface by a first gap distance.

2. The semiconductor processing chamber of claim 1, wherein the insert further includes a second insert outer surface that extends at least partially around and is outwardly offset from the first insert outer surface when viewed along the first axis.

3. The semiconductor processing chamber of claim 2, wherein the second insert outer surface is proximate to the first recessed surface.

4. The semiconductor processing chamber of claim 2, wherein:
   the insert further includes a second wall surface that extends between the second insert outer surface and the first insert outer surface, and
   the gas distribution channel is at least partially defined further by the second wall surface.

5. The semiconductor processing chamber of claim 4, wherein:
   the wafer transfer passage further includes a second recessed surface that extends around the inner passage surface and is inwardly offset from the first recessed surface when viewed along the first axis,
   the wafer transfer passage further includes a third wall surface that extends between the second recessed surface and the first recessed surface, and
   the gas distribution channel is at least partially defined further by the third wall surface.

6. The semiconductor processing chamber of claim 1, wherein the wafer transfer passage further includes a second recessed surface that extends around the inner passage surface and is inwardly offset from the first recessed surface when viewed along the first axis.

7. The semiconductor processing chamber of claim 6, wherein the first insert outer surface is proximate to the second recessed surface.

8. The semiconductor processing chamber of claim 6, wherein:
   the wafer transfer passage further includes a third wall surface that extends between the second recessed surface and the first recessed surface, and
   the gas distribution channel is at least partially defined further by the third wall surface.

9. The semiconductor processing chamber of claim 1, wherein the gas distribution channel follows a first path that extends at least partially around the insert inner surface and has a third cross-sectional area that is perpendicular to the first path.

10. The semiconductor processing chamber of claim 9, wherein the first path extends fully around the insert inner surface.

11. The semiconductor processing chamber of claim 9, wherein the third cross-sectional area remains substantially constant along the first path.

12. The semiconductor processing chamber of claim 9, wherein the third cross-sectional area varies along the first path.

13. The semiconductor processing chamber of claim 9, wherein:

the first path has a first point and a second point, wherein the first point is closer to the gas inlet along the first path than the second point and the third cross-sectional area is larger at the second point than at the first point.

14. The semiconductor processing chamber of claim 1, wherein the insert is made of two or more parts that, when assembled, form in aggregate the insert inner surface, the first insert outer surface, and the insert front surface.

15. The semiconductor processing chamber of claim 1, wherein the first recessed surface extends fully around the inner passage surface.

16. The semiconductor processing chamber of claim 1, wherein the first insert outer surface extends fully around the insert inner surface.

17. The semiconductor processing chamber of claim 1, wherein the insert includes one or more spacers that contact the first wall surface to space the insert front surface away from the first wall surface by the first gap distance.

18. The semiconductor processing chamber of claim 17, wherein the one or more spacers extend from the insert front surface.

19. The semiconductor processing chamber of claim 1, wherein the insert front surface is substantially parallel to the first wall surface.

20. The semiconductor processing chamber of claim 1, wherein the insert front surface is at an oblique angle with respect to the first wall surface.

21. The semiconductor processing chamber of claim 1, wherein the first cross-sectional area is substantially equal in size and shape to the second cross-sectional area.

22. The semiconductor processing chamber of claim 1, wherein the inner passage surface is aligned with the insert inner surface.

23. A kit comprising:
  a) a semiconductor processing chamber that includes:
    an interior volume for semiconductor processing,
    a chamber wall that at least partially bounds an outside of the semiconductor processing chamber and the interior volume,
    a wafer transfer passage that extends through the chamber wall along a first axis from the outside of the semiconductor processing chamber to the interior volume and has:
      an inner passage surface that defines an opening with a first substantially rectangular cross-sectional area perpendicular to the first axis,
      a first recessed surface that extends at least partially around and is outwardly offset from the inner passage surface when viewed along the first axis, and
      a first wall surface that extends between the inner passage surface and the first recessed surface;
    a gas inlet fluidically connected to the first recessed surface; and
  b) an insert that includes:
    an insert inner surface that defines an insert opening with a second substantially rectangular cross-sectional area perpendicular to the first axis
    a first insert outer surface that extends at least partially around and is outwardly offset from the insert inner surface when viewed along the first axis, and
    an insert front surface;
  wherein:
    at least part of the insert is configured to be inserted in into the wafer transfer passage,
    the chamber wall is configured to have at least part of the insert inserted into the wafer transfer passage, and
    when at least part of the insert is installed in the wafer transfer passage:
      the first recessed surface, the first insert outer surface, and the first wall surface at least partially define a gas distribution channel,
      the gas distribution channel is fluidically connected to the gas inlet,
      the first recessed surface is separated from the first insert outer surface by a first distance, and
      the insert front surface is separated from the first wall surface by a first gap distance.

\* \* \* \* \*